(12) United States Patent
Kim et al.

(10) Patent No.: US 10,109,106 B2
(45) Date of Patent: Oct. 23, 2018

(54) SCALABLE CURVE VISUALIZATION FOR CONFORMANCE TESTING IN VEHICLE SIMULATION

(71) Applicant: TOYOTA JIDOSHA KABUSHIKI KAISHA, Toyota-shi, Aichi-ken (JP)

(72) Inventors: BaekGyu Kim, Mountain View, CA (US); Akshay Jarandikar, Mountain View, CA (US); Shinichi Shiraishi, Mountain View, CA (US)

( * ) Notice: Subject to any disclaimer, the term of this patent is extended or adjusted under 35 U.S.C. 154(b) by 55 days.

(21) Appl. No.: 15/265,235

(22) Filed: Sep. 14, 2016

(65) Prior Publication Data
US 2018/0075647 A1 Mar. 15, 2018

(51) Int. Cl.
| G06T 19/00 | (2011.01) |
| G06T 19/20 | (2011.01) |
| G05D 1/00 | (2006.01) |
| G06F 17/50 | (2006.01) |

(52) U.S. Cl.
CPC ............. *G06T 19/00* (2013.01); *G05D 1/00* (2013.01); *G06T 19/20* (2013.01); *G06F 17/5009* (2013.01); *G06F 17/5095* (2013.01)

(58) Field of Classification Search
None
See application file for complete search history.

(56) References Cited

PUBLICATIONS

Taeyoung Chung and Kyongsu Yi, "Design and Evaluation of Side Slip Angle-Based Vehicle Stability Control Scheme on a Virtual Test Track", Feb. 21, 2006, IEEE, IEEE Transactions on Control Systems Technology, vol. 14, No. 2, pp. 224-234.*
Luigi Cardamone, Pier Luca Lanzi, Daniele Loiacono, "TrackGen: An interactive track generator for TORCS andSpeed-Dreams", Dec. 15, 2014, Elsevier, Applied Soft Computing 28 (2015) 550-558.*
J. W. Woo, S. B. Yu, S. B. Lee, "Design and Simulation of a Vehicle Test Bed Based on Intelligence Transport Systems", Apr. 9, 2016, KSAE, International Journal of Automotive Technology, vol. 17, Issue 2, pp. 353-359.*

(Continued)

*Primary Examiner* — Robert Bader
(74) *Attorney, Agent, or Firm* — Burbage Law, P.C.; Jon-Michael Burbage; Elizabeth Ruzich

(57) ABSTRACT

The disclosure includes a system, method and tangible memory for depicting a graphical display output including a visualization of a virtual roadway including a curve that complies with a curve testing standard. The method may include providing a set of curve data describing one or more criteria of the curve testing standard to a Satisfiability Modulo Theories solver ("SMT solver"). The SMT solver is operable to analyze the one or more criteria to output a three-dimensional coordinate. The method may include providing the three-dimensional coordinate to the virtualization application as an input. The virtualization application may be operable to generate curves based on a three-dimensional coordinate received as an input. The method may include the virtualization application generating graphical data based on the input that causes the electronic display to depict the visualization including the virtual roadway including the curve that complies with the curve testing standard.

19 Claims, 13 Drawing Sheets

(56) References Cited

PUBLICATIONS

William N. N. Hung, Xiaoyu Song, Jindong Tan, Xiaojuan Li, Jie Zhang, Rui Wang and Peng Gao, "Motion Planning with Satisfiability Modulo Theories", Jun. 7, 2014, IEEE, 2014 IEEE International Conference on Robotics & Automation (ICRA).*

Leonardo de Moura, Nikolaj Bjørner, "Z3: An Efficient SMT Solver", 2008, Springer, TACAS 2008: Tools and Algorithms for the Construction and Analysis of Systems, pp. 337-340.*

Duoduo Liao, "A Real-time High-fidelity Driving Simulator System", Sep. 18, 2006, IEEE, Proceedings of the 11th IEEE International Conference on Engineering of Complex Computer Systems (ICECCS'06).*

E. Galin, A. Peytavie, N. Maréchal, E. Guérin, "Procedural Generation of Roads", May 2010, Blackwell Publishing, Computer Graphics Forum, vol. 29, Issue 2, pp. 429-438.*

Jiao Jian Wang, Olana Missura, "Racing Tracks Improvisation", Aug. 29, 2014, IEEE, 2014 IEEE Conference on Computational Intelligence and Games.*

Zhao et al, Automated Generation of Virtual Scenarios in Driving Simulator from Highway Design Data, Southwest Region University Transportation Center, Sep. 2010, pp. 1-50, Report SWUTC/10/47660-00018-1, The Texas A&M University System, College Station, Texas, USA.

Kreft et al, Automated Generation of Virtual Roadways Based on Geographic Information Systems, ASME 2011 International Design Engineering Technical Conferences and Computers and Information in Engineering Conference, Aug. 2011, pp. 1525-1531, Paper No. DETC2011-48141, ASME.

\* cited by examiner

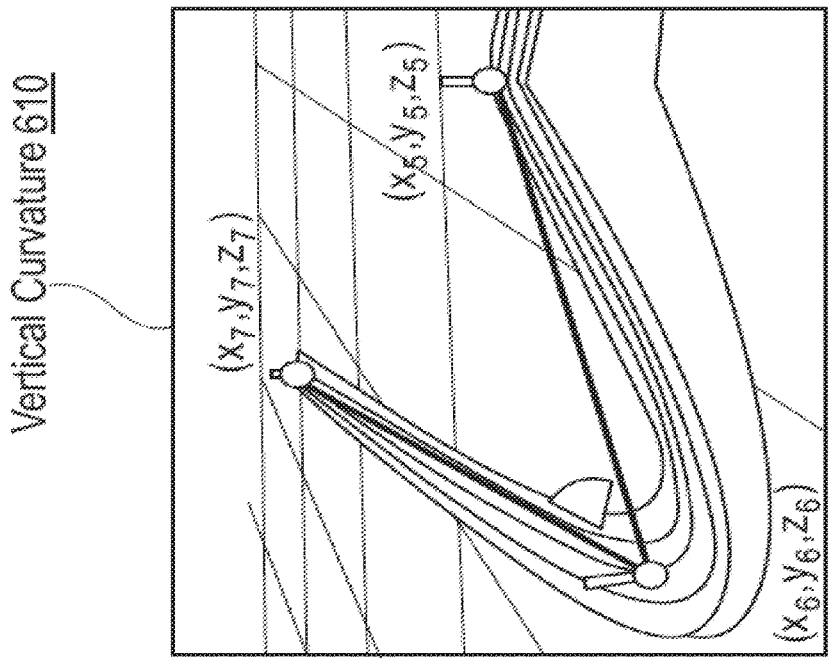
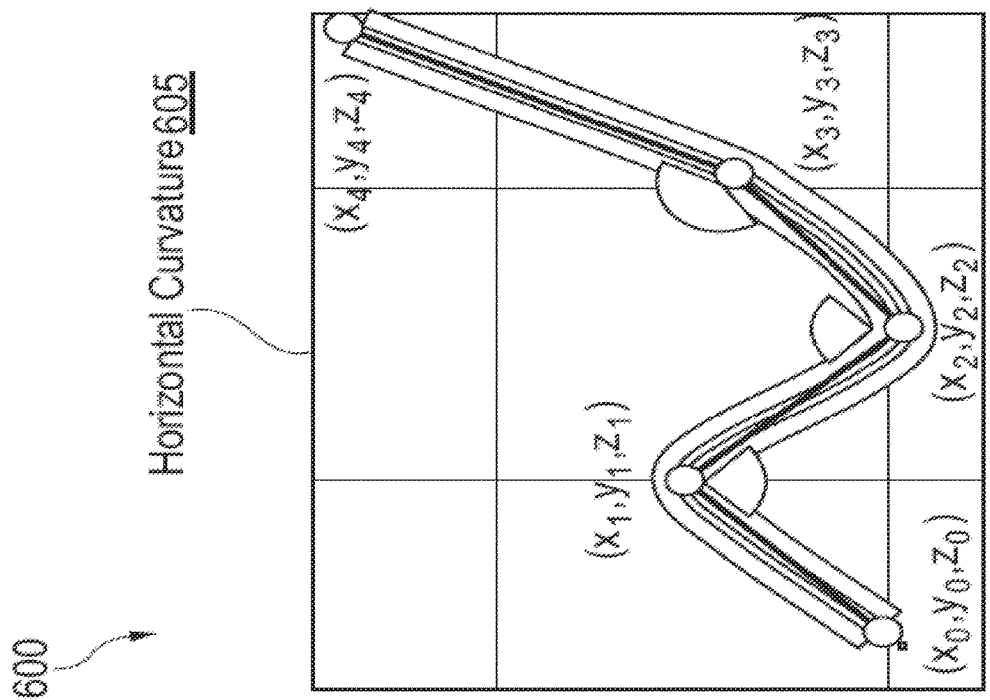
Figure 6A

```
1  SRoadGen(C, q)
2    try
3      p ← rand(); cnt ← 0;
4      while (cnt < q)
5        switch(r_i ← Solver(φ(C), p, t_max))
6        case SAT:
7          S ← S ∪ r_i: φ(C) ← φ(C) ∧ ¬ r_i: cnt ← cnt + 1;
8          break;
9        case UNSAT:
10         Exception(No-Sol); break;
11        case TIMEOUT:
12         p ← rand(); break;
13       endswitch
14     endwhile
15     return S;
16   catch(Global-TimeOut){Exceptionhandler}
17   catch(No-Sol){Exceptionhandler}
18 EndSRoadGen
```

Figure 9

```
1   Coverage-Consistency ([C_j]^k, C_g)
2   //Consistency check for the criteria of N
3   if (k-1)+∑_{i=1}^{i=k} C_i.n_min < C_g.n_min
4       return false;
5   elseif (k-1)+∑_{i=1}^{i=k} C_i.n_max > C_g.n_max
6       return false;
7   //Consistency check for the criteria of θ
8   elseif ∃ i such that C_i.θ_min < C_g.θ_min
9       return false;
10  elseif ∃ i such that C_i.θ_max > C_g.θ_max
11      return false;
12  //Consistency check for the criteria of D
13  elseif ∃ i such that C_i.d_min < C_g.d_min
14      return false;
15  elseif ∃ i such that C_i.d_max > C_g.d_max
16      return false;
17  else
18      return true;
19  endif
20  EndCoverage-Consistency
```

Figure 10

```
1  NRoadGen(([C_i]^k_j, C_g)
2  try
3    if Coverage-Consistency (([C_i]^k_j, C_g) = false
4      Exception(No-Sol);
5    endif
6    for i = 1 : k
7      r_i ← SRoadGen(C_i, 1);
8      φ(C_{i+1}) ← φ(C_{i+1}) ∧ (((x^i_m, y^i_m, z^i_m) = (x^{i+1}_j, y^{i+1}_j, z^{i+1}_j))
9        ∧ (θ^g_{min} ≤| y^{i+1}_j - y^i_m / x^{i+1}_g - x^i_m |≤ θ^g_{max})
10       ∧ (θ^g_{min} ≤| z^{i+1}_j - z^i_m / x^{i+1}_g - x^i_m |≤ θ^g_{max})   ;
11     S ← S ∪ r_i;
12   endfor
13   return S;
14  catch(Global-TimeOut){Exceptionhandler}
15  catch(No-Sol){Exceptionhandler}
16 EndNRoadGen
```

SCALABLE CURVE VISUALIZATION FOR CONFORMANCE TESTING IN VEHICLE SIMULATION

RELATED APPLICATIONS

The specification is related to U.S. patent application Ser. No. 15/013,936 filed on Feb. 2, 2016 and entitled "Realistic Roadway Virtualization System," the entirety of which is hereby incorporated by reference.

BACKGROUND

The specification relates to scalable curve visualization for conformance testing in vehicle simulation.

Roadway virtualization software exists in the marketplace. Virtualization applications predict the performance of vehicles in response to virtualized driver controls (steering, throttle, brakes, clutch and shifting) in a virtual world. An example of such software includes CarSim and Prescan, among others.

SUMMARY

Vehicles increasing include one or more Advanced Driver Assistance Systems ("ADAS system" if singular, "ADAS systems" if plural). ADAS systems are tested prior to their release to the public to confirm that they function correctly based on a specification of the ADAS system or some other known standard (e.g., a known government or industry safety standard).

One way of testing an ADAS system is to generate a virtualized world that includes a virtual vehicle operating on a virtual roadway included in a virtual road environment. The virtual vehicle may be modeled to include a virtualized version of the ADAS system that reacts in the virtualized world in a way that is the same or similar to how the real-world version of the ADAS system would react in the real-world.

Virtualization applications, such as CarSim and Prescan, are increasingly used to test the correctness of an ADAS system included in a virtual vehicle modeled based on a real world vehicle. CarSim is produced and distributed by Mechanical Simulation Corporation of Ann Arbor, Mich. Prescan is produced and distributed by Tass International of Helmond, Netherlands.

When testing a design of a ADAS system, the virtualization application generates a visualization that includes a virtual vehicle (and the virtual version of the ADAS system) operating in a virtual road environment. The virtualization application monitors and measures the performance of the virtual version of the ADAS system to determine, for example, whether the virtual version ADAS system (and therefore, also the real world version of the ADAS system) is operating correctly (e.g., in accordance with a specification of the ADAS system, in accordance with an industry or government-established safety standard, in accordance with an expectation of the designer of the ADAS system, etc.).

Of interest in testing ADAS systems using a virtualization application is how the ADAS system handles roadway curves since curves limit the line of sight (or sight distance) of both the driver and the vehicle's sensor (upon which the performance of the ADAS system may depend) in a range of situations. Currently engineers must manually design the virtual road environment in an ad hoc fashion. The goal of these engineers is that the curves conform to standards for curve testing, such as International Organization of Standardization (herein "ISO") 15622 (i.e., "ISO 15622"). Other example curve testing standards include the following: ISO 11270; ISO 3888; ISO 11067; ISO 17361; and ISO 17387. This ad hoc approach includes a time consuming process, and there is no guarantee that the curves created by the engineers actually comply with the curve testing standards so that their time may have been wasted. The roadway visualization system described herein (see, e.g., element 199 of FIG. 1A) solves this problem by providing automated generation of virtual roadways structures in the virtual road environment that include one or more curves are guaranteed to conform to one or more specified standards for curve testing.

In some embodiments, the roadway visualization system beneficially automates the process of generating various realistic roadway structures in one or more virtualization applications. The roadway structures generated by the roadway visualization system include curves that are guaranteed to comply with certain standards for curve testing, such as ISO 15622. The roadway visualization system may include a plugin for use in an existing virtualization application or a standalone, complete end-to-end virtualization application that includes automated generation of one or more virtual roadways that includes curves that comply with one or more specified curve testing standards.

Accordingly, the roadway visualization system described herein beneficially provides a virtualization application that is operable to automatically generate roadways for inclusion in a virtual road environment that includes curves that are guaranteed to comply with one or more curve testing standards. No other solution can provide this functionality. The only other solution is for an engineer to manually create the curves in an ad hoc fashion. However, with this manual approach there is no way to know whether the curves comply with curve testing standards (see, e.g., FIGS. 4-8). The roadway visualization system will now be described according to some embodiments.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

One general aspect includes a system to depict a graphical display output including a visualization of a virtual roadway including a curve that complies with a curve testing standard, the system including: a roadway visualization system including a non-transitory memory, a processor, an electronic display and a virtualization application including a curve system, where the virtualization application and the curve system are stored in non-transitory memory which is communicatively coupled to the processor; where the virtualization application includes instructions that, responsive to being executed by the processor and receiving an input from the curve system, cause the processor to generate graphical data operable to cause the electronic display to depict a visualization including a virtual environment having a virtual roadway including a curve that is generated based on the input from the curve system; where the roadway visualization system is communicatively coupled to a Satisfiability Modulo Theories solver ("SMT solver"); where the curve system includes instructions that, responsive to being executed by the processor, cause the processor to perform steps including: importing curve testing standard data describing a plurality of criteria for the curve to comply with a curve testing standard; selecting a set of curve data from the curve testing standard data that describes one or more criteria from the plurality of criteria; providing the set of curve data to the SMT solver which is operable to analyze the one or more criteria to output a three-dimensional coordinate; providing the three-dimensional coordinate to the virtualization application as the input; and where the virtualization application generates the graphical data based on the input and causes the electronic display to depict the visualization including the virtual roadway including the curve that complies with the curve testing standard. Other embodiments of this aspect include corresponding computer systems, apparatus, and computer programs recorded on one or more computer storage devices, each configured to perform the actions of the methods.

Embodiments may include one or more of the following features. The system where the curve system is a plug-in that is an element of the virtualization application. The system where curve testing standard is selected from a set including one or more of the following curve testing standards: ISO 15622; ISO 11270; ISO 3888; ISO 11067; ISO 17361; and ISO 17387. The system where the SMT solver is an element of a server. The system where the roadway visualization system is communicatively coupled to the server via a wireless network. The system where the roadway visualization system is operable so that the curves generated by the virtualization application always comply with the curve testing standard. The system where the visualization is generated within a predetermined time constraint. Embodiments of the described techniques may include hardware, a method or process, or computer software on a computer-accessible medium.

One general aspect includes a method to depict a graphical display output including a visualization of a virtual roadway including a curve that complies with a curve testing standard, the method including importing curve testing standard data describing a plurality of criteria for the curve to comply with a curve testing standard to a curve system included in a virtualization application, where the virtualization application includes instructions that, responsive to being executed by a processor, cause the processor to generate graphical data operable to cause an electronic display communicatively coupled to the virtualization application to depict a visualization including a virtual environment having a virtual roadway including a curve that is generated based on an input describing a three-dimensional coordinate; providing, by the curve system, a set of curve data to a SMT solver, where the set of curve data describes one or more criteria from the plurality of criteria and the SMT solver is operable to analyze the one or more criteria to output the three-dimensional coordinate which is configured by the SMT solver to cause the virtualization application to output the curve that is compliant with the one or more criteria described by the set of curve data; and providing the three-dimensional coordinate to the virtualization application as the input, where the virtualization application generates the graphical data based on the input and causes the electronic display to depict the visualization including the virtual roadway including the curve that complies with the curve testing standard. Other embodiments of this aspect include corresponding computer systems, apparatus, and computer programs recorded on one or more computer storage devices, each configured to perform the actions of the methods.

Embodiments may include one or more of the following features. The method where the curve system is a plug-in that is an element of the virtualization application. The method where the curve testing standard is selected from a set including one or more of the following curve testing standards: ISO 15622; ISO 11270; ISO 3888; ISO 11067; ISO 17361; and ISO 17387. The method where the SMT solver is an element of a server. The method where the curve system is communicatively coupled to the server via a wireless network. The method where the virtualization application is operable so that the curves generated by the virtualization application always comply with the curve testing standard because the curves are always generated based on the one or more criteria of the curve testing standard. The method where the visualization is generated within a predetermined time constraint. Embodiments of the described techniques may include hardware, a method or process, or computer software on a computer-accessible medium.

One general aspect includes a non-transitory memory including computer code which, when executed by a processor, causes the processor to perform steps including: importing curve testing standard data describing a plurality of criteria for a curve to comply with a curve testing standard to a curve system included in a virtualization application, where the virtualization application includes instructions that, responsive to being executed by a processor, cause the processor to generate graphical data operable to cause an electronic display communicatively coupled to the virtualization application to depict a visualization including a virtual environment having a virtual roadway including a curve that is generated based on an input describing a three-dimensional coordinate; providing, by the curve system, a set of curve data to a SMT solver, where the set of curve data describes one or more criteria from the plurality of criteria and the SMT solver is operable to analyze the one or more criteria to output the three-dimensional coordinate which is configured by the SMT solver to cause the virtualization application to output the curve that is compliant with the one or more criteria described by the set of curve data; and providing the three-dimensional coordinate to the virtualization application as the input, where the virtualization application generates the graphical data based on the input and causes the electronic display to depict the visualization including the virtual roadway including the curve that complies with the curve testing standard. Other embodiments of this aspect include corresponding computer systems, apparatus, and computer programs recorded on one or more computer storage devices, each configured to perform the actions of the methods.

Embodiments may include one or more of the following features. The non-transitory memory where the curve system is a plug-in that is an element of the virtualization application. The non-transitory memory where the curve testing standard is selected from a set including one or more of the following curve testing standards: ISO 15622; ISO 11270; ISO 3888; ISO 11067; ISO 17361; and ISO 17387. The non-transitory memory where the SMT solver is an element of a server. The non-transitory memory where the curve system is communicatively coupled to the server via a wireless network. The non-transitory memory where the virtualization application is operable so that the curves generated by the virtualization application always comply with the curve testing standard because the curves are always generated based on the one or more criteria of the curve testing standard. Embodiments of the described techniques may include hardware, a method or process, or computer software on a computer-accessible medium.

BRIEF DESCRIPTION OF THE DRAWINGS

The disclosure is illustrated by way of example, and not by way of limitation in the figures of the accompanying drawings in which like reference numerals are used to refer to similar elements.

FIG. 6A is a block diagram including an example set of graphical user interfaces including examples of a horizontal curvature constraint and a vertical curve constraint.

FIG. 9 is a block diagram including an example of a road segment generation algorithm which may be applied by the roadway visualization system.

FIG. 10 is a block diagram including an example of a coverage consistency algorithm which may be applied by the roadway visualization system.

FIG. 11 is a block diagram including an example of a virtual roadway generation algorithm which may be applied by the roadway visualization system.

DETAILED DESCRIPTION

Figure 1A:
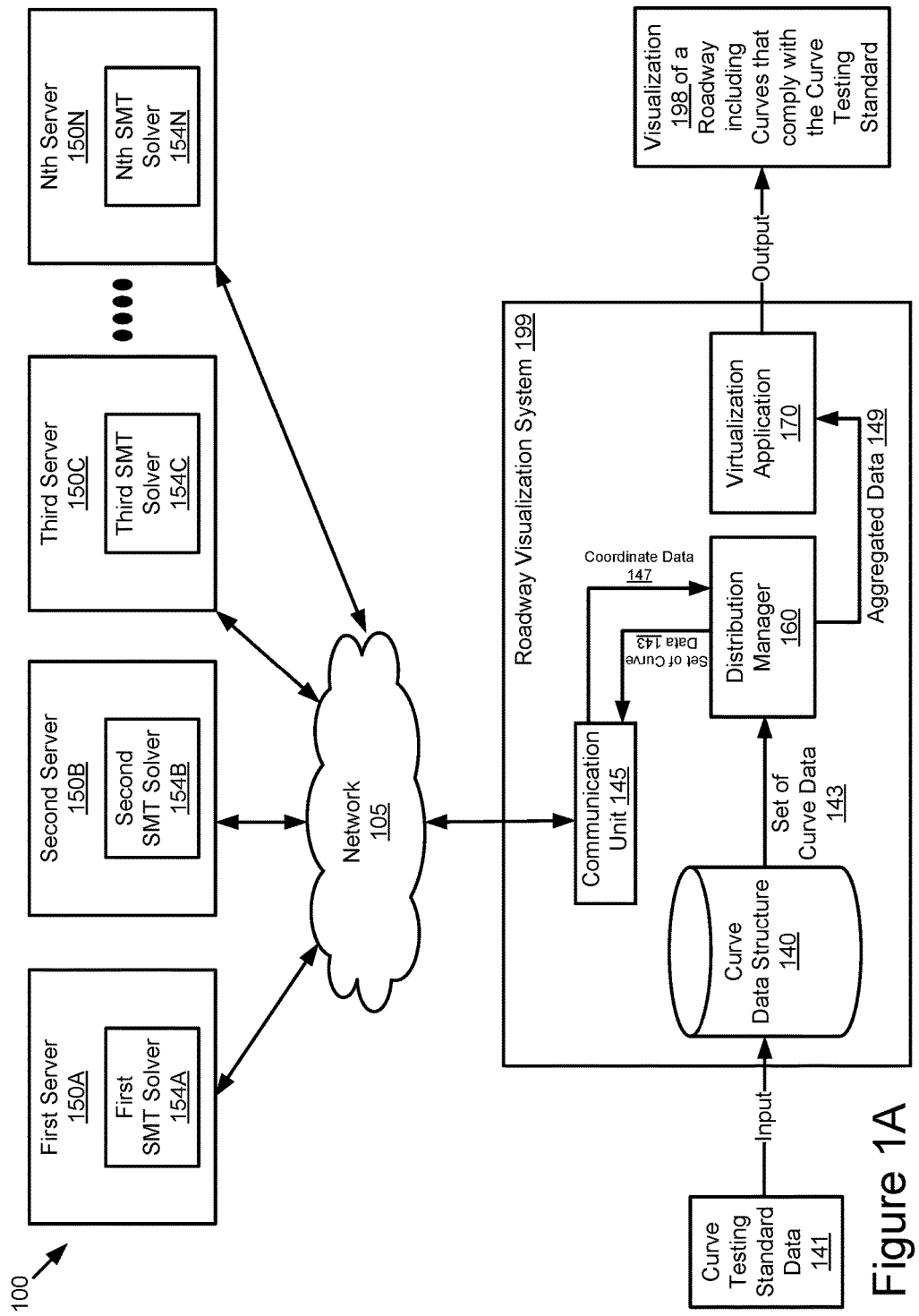
FIG. 1A is a block diagram illustrating an example operating environment for a realistic roadway visualization system.

An automotive system may include a vehicle. Vehicles increasingly include one or more ADAS systems. An ADAS system may provide one or more safety features. In some embodiments, one or more ADAS systems may cause a vehicle to operate as an autonomous vehicle.

Examples of ADAS systems include the following: an adaptive cruise control ("ACC") system; an adaptive high beam system; an adaptive light control system; an automatic parking system; an automotive night vision system; a blind spot monitor; a collision avoidance system; a crosswind stabilization system; a driver drowsiness detection system; a driver monitoring system; an emergency driver assistance system; a forward collision warning system; an intersection assistance system; an intelligent speed adaption system; a lane departure warning system; a pedestrian protection system; a traffic sign recognition system; a turning assistant; and a wrong-way driving warning system.

A vehicle may include a plurality of ADAS systems. These ADAS systems may provide a plurality of safety features. These ADAS systems may be included in a safety system of a vehicle. The safety system may include one or more of the following: one or more onboard vehicle computers; the plurality of ADAS systems; and one or more virtualization modules.

The one or more onboard vehicle computers may include one or more electronic control units ("ECU" if singular, "ECUs" if plural).

In some embodiments, one or more of the ADAS systems may be provided by a virtual machine that virtualizes the operation of one or more hardware, software or firmware components to provide the functionality of an ADAS systems in the real world. For example, the virtualization module may include one or more a hypervisor and a virtual machine monitor that is stored in a non-transitory memory of the safety system. A processor (e.g., a processor of an onboard vehicle computer or an ECU) may execute the hypervisor or the virtual machine monitor and, responsive to this execution, the hypervisor or the virtual machine monitor may cause the processor to create and run one or more virtual machines that provide virtualized hardware which are operable to provide a virtualized version of an ADAS system that provides one or more of the safety features described herein. In some embodiments, for this virtualization, the same application can be deployed among different kinds of vehicle platforms as different virtual runtime platforms.

Example Curve Testing Standard

Many international testing standards specify the necessary parameters to design test tracks for curve testing. For example, according to the ISO 15622 adaptive cruise control (ACC) testing standard, a vehicle needs to pass the curve capability test in various minimum curve radius from 500 meters down to 125 meters.

Currently, engineers design virtual roadways that have curves. The curves are designed in a manual and ad-hoc fashion. This approach is not desirable, for example, because it is timing consuming and lacks any guarantee that the resulting roadways conform to the testing standards.

The roadway visualization system described herein beneficially provides a virtualization application that is operable to automatically generate curves for inclusion in a virtual roadway that are guaranteed to conform to curve testing standards such as ISO 15622. It will be understood that the roadway visualization system is operation to generate curves that conform to any curve testing standard, and not just ISO 15622. Other example curve testing standards include the following: ISO 11270; ISO 3888; ISO 11067; ISO 17361; and ISO 17387.

Curve Data

The roadway visualization system may receive an input describing one or more curve testing standards. The roadway visualization system may use this input to generate a data structure (e.g., a database, a table, etc.) that stores curve data. The curve data may describe ((1) a plurality of curve characteristics and (2) a plurality of roadway parameters. The curve data may be configured so that a virtual roadway built based on the curve data complies with the one or curve testing standards. The roadway visualization system may use the curve data to generate curves for inclusion in a virtual roadway. The curves of the virtual roadway built by the roadway visualization system always comply with the one or more curve testing standards. See, for example, the curve data structure 140 described below with reference to FIG. 1A and the curve data also described with reference to the curve data structure 140 of FIG. 2.

In some embodiments, the curve characteristics described by the curve data may include one or more of the following: a number of curves to be included in a virtual roadway; a horizontal curvature and vertical curvature for one or more curves (e.g., "a horizontal/vertical pair"); and distances among different curves of the virtual roadway in terms of the minimum and maximum parameters for distance. As described below, the roadway visualization system may generate curves that conform to the curve data, and therefore also conform to the one or more curve testing standards that were received as an input.

In some embodiments, the roadway parameters described by the curve data may include one or more of the following: speed limit; total number of lanes included in the virtual roadway system; total number of right-hand lanes included in the virtual roadway system; total number of left-hand lanes included in the virtual roadway system; roadway length for the virtual roadway system; land width for each lane included in the virtual roadway system: the dividing line striping option for each lane transition of the virtual roadway system (e.g., no dividing line; broken or dashed line; solid double line; solid line or left and broken line on the right; broken line on the left and solid line on the right; double solid line); the edge line for each outside lane included in the virtual roadway system; the visibility of dividing line options or edge line by automobile sensors such as cameras (e.g., is the dividing line or edge line obscured or old so that is hard to identify by the sensors of an autonomous vehicle); shoulder width for outside lanes included in the virtual roadway system; foreslope on the left or right-hand side; roadway cross-slope on the left or right-hand side; placement of curves along the virtual roadway system; angle of curves along the virtual roadway system; roadway slope inside of curves along the virtual roadway system; coefficients of friction along the virtual roadway system, transitions from coefficients for friction along the virtual roadway system and the placement of these transitions on the virtual roadway system, etc.

In some embodiments, the roadway visualization system 199 may include a realism system as described in U.S. patent application Ser. No. 15/013,936 filed on Feb. 2, 2016 and entitled "Realistic Roadway Virtualization System," the entirety of which is hereby incorporated by reference. The realism system may generate the roadway parameters as described in U.S. patent application Ser. No. 15/013,936. The roadway parameters may be checked against the one or more curve testing standards to ensure that their application to generating a virtual roadway would conform with these curve testing standards.

Satisfiability Modulo Theories Solver

Figure 1B:
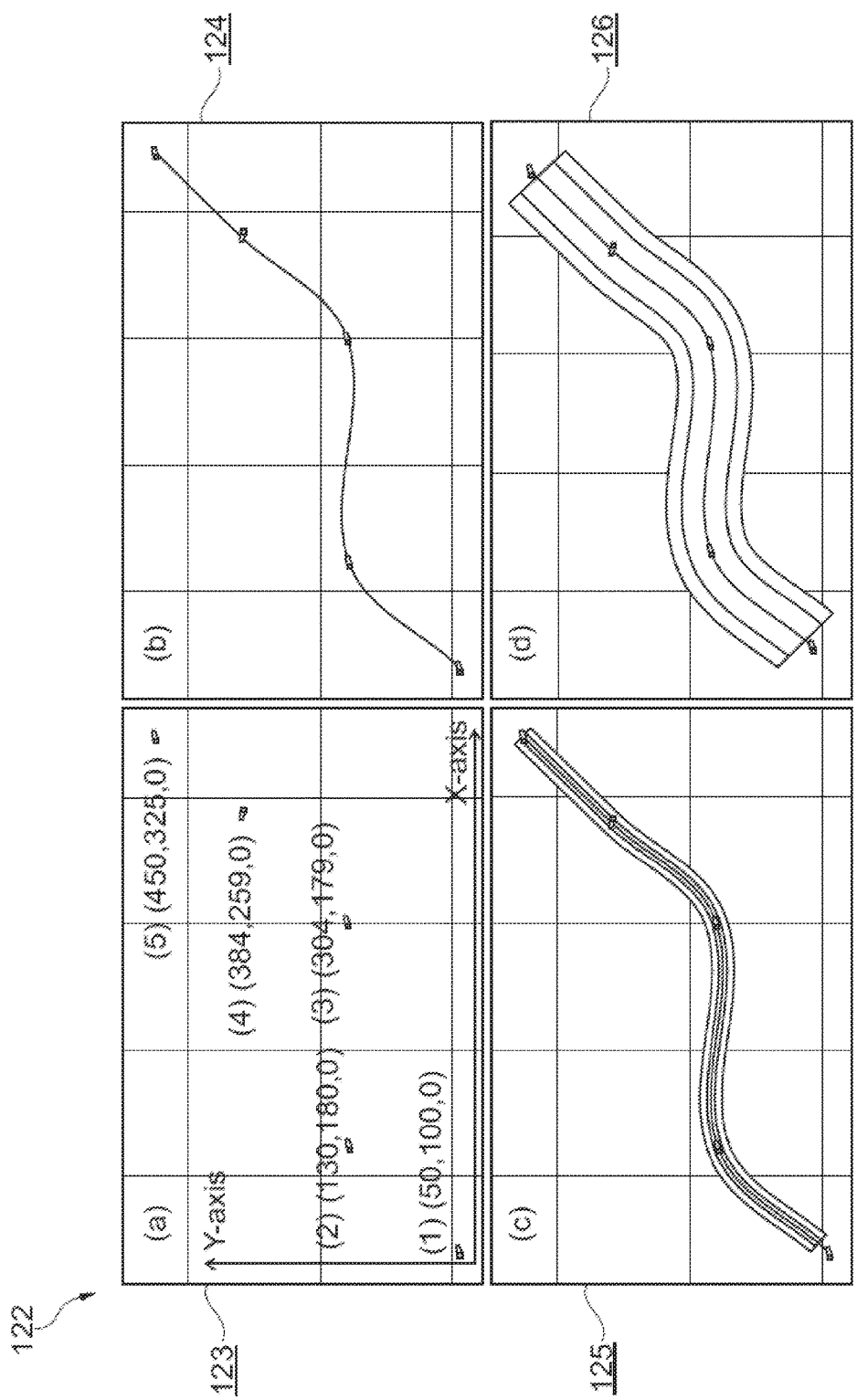
FIG. 1B is a block diagram illustrating a coordinate interpolation scheme for generating curves for a virtual roadway.
Figure 4:
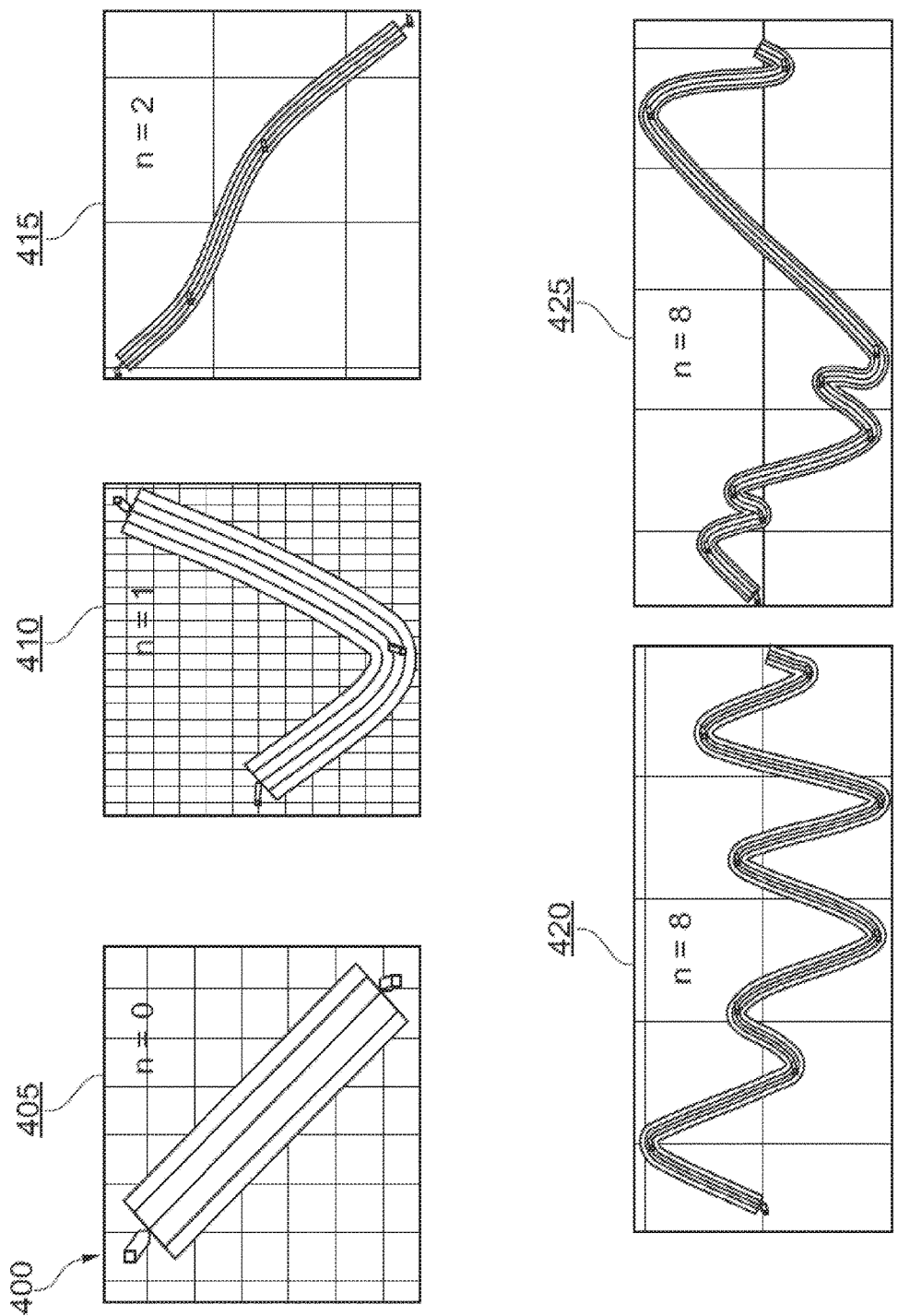
FIG. 4 is a block diagram including an example set of example graphical user interfaces including a plurality of virtual roadway segments having designated number "n" of curves.
Figure 5:
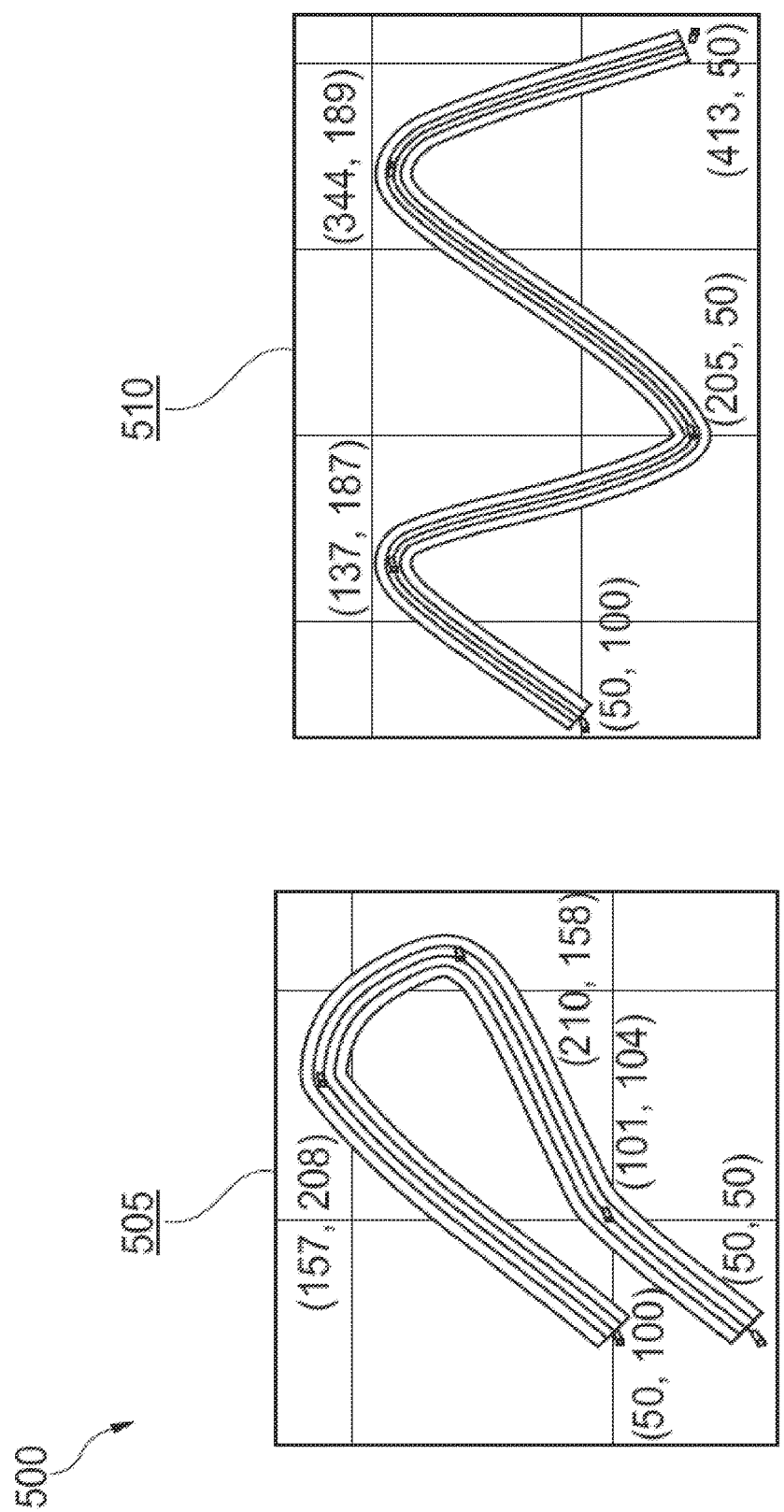
FIG. 5 is a block diagram including an example set of graphical user interfaces including examples of a node order constraint.

A virtualization application is configured so that it generates a curve using a three-dimensional coordinate (e.g., an "X, Y, Z coordinate" or Cartesian coordinate) as an input to specify the location of a curve in a virtual roadway (see, e.g., FIGS. 1B, 5, 6). The virtualization application outputs a virtual roadway including a curve responsive to receiving this three-dimensional coordinate as an input. The number of curves present in the virtual roadway corresponds to the number of three-dimensional coordinates that are inputted to the virtualization application (see, e.g., FIG. 4).

For example, the virtualization application generates a GUI that includes a graphical field (or three graphical fields) for inputting the three-dimensional coordinate. Ordinarily this may be done in an ad hoc fashion by an engineer manually inputting three-dimensional coordinates and tweaking the input to arrive at a curve (or set of curves) that they hope will comply with a testing standard. The roadway visualization system described herein automatically determines one or more three-dimensional coordinates that are guaranteed to cause the virtualization application to generate one or more virtual roadways that include one or more curves that comply with any predetermined curve testing standard.

In some embodiments, the roadway visualization system may automatically input the three-dimensional coordinates into a GUI of the virtualization application. Optionally, the virtualization application may include one or more routines having a command that calls the data describing the three-dimensional coordinate from the roadway visualization system (which may be a plugin for the virtualization application). In this way the roadway visualization system may provide data describing the three-dimensional coordinate to the virtualization application so that the virtualization application may generate one or more virtual roadways that include one or more curves that comply with any predetermined curve testing standard.

The roadway visualization system may include one or more Satisfiability Modulo Theories solvers (a "SMT solver" if singular, or "SMT solvers" if plural) or be communicatively coupled to one or more SMT solvers (see, e.g., FIG. 1A). The SMT solver may receive a set of curve data as an input. The SMT solver may automatically determine a three-dimensional coordinate based on the set of curve data that are received as an input. The SMT solver may output data describing the three-dimensional coordinate. The roadway visualization system may receive the data describing the three-dimensional coordinate from the SMT solver. The roadway visualization system may provide the data describing the three-dimensional coordinate to the virtualization application so that the virtualization application outputs a roadway including a curve generated based on the three-dimensional coordinate. Since the three-dimensional coordinate is generated based on curve parameters determined from a known curve testing standard, the curve generated by the virtualization application will comply with that curve testing standard.

Curve Generation Using a Distribution Manager

Experimentation has shown that SMT solvers are time efficient when determining a three-dimensional coordinate that satisfies the requirements of a set of curve data (e.g., satisfies or complies with the curve characteristics and roadway parameters). However, experimentation has also shown that if an SMT solver is provided too many sets of curve parameters to solve, it may take a long time for the SMT solver provide any output (e.g., the SMT solver churns responsive to receiving the input and appears to have a fault, or causes the roadway visualization system to appear to have a fault, or the SMT solver actually has a timeout fault). To solve this problem, in some embodiments the roadway visualization system includes a distribution manager. The distribution manager is operable to manage the inputs provided to a plurality of SMT solvers so that (1) each SMT solver outputs a three-dimensional coordinate within some predetermined time constraint and (2) the roadway visualization system outputs a visualization of a roadway including one or more curves that comply with the one or more curve testing standards within some predetermined time constraint.

For example, each SMT solver may be located on a cloud server. There may be many different cloud servers, each including a single SMT solver. In some embodiments, there may be a first SMT solver operable on a first server, a second SMT solver operable on a second server and a third SMT solver operable on a third server. The distribution manager may retrieve one or more sets of curve data from the curve data. For example, the distribution manager may retrieve a first set of curve data, a second set of curve data and a third set of curve data. A single SMT solver is able to analyze and determine a three-dimensional coordinate for a single set of curve data in a timely fashion. However, a single SMT solver cannot timely solve many sets of curve parameters so that the roadway visualization system provides a timely and desirable experience to a human user of the roadway visualization system or avoids an actual timeout fault. The distribution manager may solve this problem.

Accordingly, the distribution manager may send the first set of curve data to the first SMT solver of the first server and receive a first three-dimensional coordinate from the first server in return. The distribution manager may send the second set of curve data to the second SMT solver of the second server and receive a second three-dimensional coordinate from the second server in return. The distribution manager may send the third set of curve data to the third SMT solver of the third server and receive a third 3D coordinate from the third server in return. The distribution manager may then provide the first, second and third three-dimensional coordinates to the virtualization application. The virtualization application may then output a roadway having a plurality of curves that are guaranteed to comply with curve testing standards because they were built using curve parameters determined based on the criteria of the one or more curve testing standards.

Example System Overview

FIG. 1A illustrates a block diagram of one embodiment of an environment 100 for a roadway visualization system 199. The environment 100 includes the roadway visualization system 199 and a plurality of servers 150A, 150B, 150C . . . 150N (referred to collectively as "servers 150" or individually as "server 150"). In the illustrated embodiment, these entities of the environment 100 may be communicatively coupled via a network 105.

In some embodiments, the roadway visualization system 199 may receive curve testing standard data 141 as an input. The curve testing standard data 141 may describe one or more requirements for the curves of a roadway that must be satisfied (or complied with) in order for the roadway to comply with one or more known curve testing standards such as ISO 15622 (or any derivative or later version thereof). The roadway visualization system 199 may output a visualization 198 of a roadway that includes one or more curves that meet the curve criteria associated with the one or more curve testing standards. The visualization may include a graphical user interface ("GUI") displayed on a monitor that is communicatively coupled to the roadway visualization system 199.

The servers 150 and the roadway visualization system 199 can be used by way of example. While FIG. 1A illustrates four servers 150 and one roadway visualization system 199, the disclosure applies to a system architecture having one or more servers 150 and one or more roadway visualization systems 199. Furthermore, although FIG. 1A illustrates one network 105 coupled to the servers 150 and the roadway visualization system 199, in practice one or more networks 105 can be connected to these entities.

The network 105 can be a conventional type, wired or wireless, and may have numerous different configurations including a star configuration, token ring configuration, or other configurations. Furthermore, the network 105 may include a local area network (LAN), a wide area network (WAN) (e.g., the Internet), or other interconnected data paths across which multiple devices may communicate. In some embodiments, the network 105 may be a peer-to-peer network. The network 105 may also be coupled to or include portions of a telecommunications network for sending data in a variety of different communication protocols. In some embodiments, the network 105 includes Bluetooth® communication networks or a cellular communications network for sending and receiving data via short messaging service (SMS), multimedia messaging service (MMS), hypertext transfer protocol (HTTP), direct data connection, WAP, e-mail, etc. The network 105 may be a mobile data network such as 3G, 4G, LTE, Voice-over-LTE ("VoLTE"), or any other mobile data network or combination of mobile data networks.

The roadway visualization system 199 may include a processor-based computing device. The roadway visualization system 199 may be implemented on a client or a special-purpose computing device. The roadway visualization system 199 may include a processor, a memory and network communication capabilities.

Figure 2:
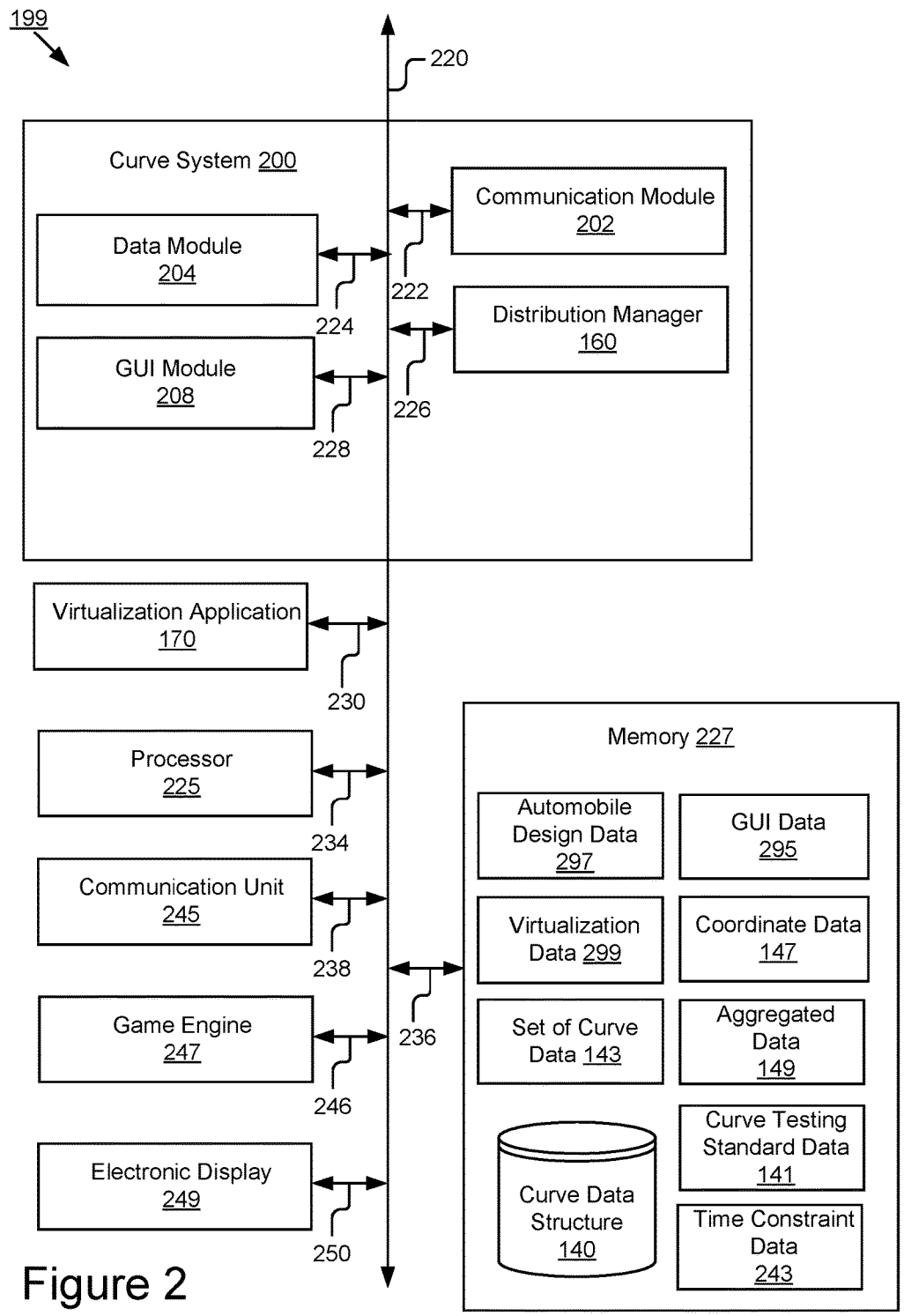
FIG. 2 is a block diagram illustrating a computing device including an example roadway visualization system.

An example embodiment of the roadway visualization system 199 is depicted in FIG. 2.

In some example embodiments, the roadway visualization system 199 may include a personal computer, laptop, tablet computer, hardware server, set top box or some other processor-based computing device that is modified to include code and routines that are operable to provide the functionality described herein with reference to the roadway visualization system 199.

The roadway visualization system 199 may include one or more of the following elements: a curve data structure 140; a communication unit 145; a distribution manager 160; and a virtualization application 170.

The roadway visualization system 199 may receive the curve testing standard data 141 as an input and build the curve data structure 140 based on the curve testing standard data 141. The curve data structure 140 may include a database, table or some other data structure that describes a plurality of sets of curve data.

The curve data structure 140 may store curve data. The curve data may describe (1) a plurality of curve characteristics and (2) a plurality of roadway parameters. The curve data may be configured so that a virtual roadway built based on the curve data complies with the one or curve testing standards described by the curve testing standard data 141. In some embodiments, the roadway visualization system may use the curve data stored in the curve data structure 140 to generate curves for inclusion in a virtual roadway. Because they are built based on the curve data included in the curve data structure 140, the curves built by the roadway visualization system 199 are configured so that they always comply with the one or more curve testing standards described by the curve testing standard data 141.

In some embodiments, the curve characteristics described by the curve data may include one or more of the following: a number of curves to be included in a virtual roadway; a horizontal curvature and vertical curvature for one or more curves (e.g., "a horizontal/vertical pair"); and distances among different curves of the virtual roadway in terms of the minimum and maximum parameters for distance. As described below, the roadway visualization system 199 may generate curves that conform to the curve data, and therefore also conform to the one or more curve testing standards that were received as an input.

In some embodiments, the roadway parameters described by the curve data may include one or more of the following: a speed limit; a total number of lanes included in the virtual roadway system; a total number of right-hand lanes included in the virtual roadway system; a total number of left-hand lanes included in the virtual roadway system; a roadway length for the virtual roadway system; land width for each lane included in the virtual roadway system; a dividing line striping option for each lane transition of the virtual roadway system (e.g., no dividing line; a broken or dashed line; a solid double line; a solid line or left and broken line on the right; a broken line on the left and solid line on the right; double solid line); an edge line for each outside lane included in the virtual roadway system; the visibility of dividing line options or edge line by automobile sensors such as cameras (e.g., is the dividing line or edge line obscured or old so that is hard to identify by the sensors of an autonomous vehicle); a shoulder width for outside lanes included in the virtual roadway system; a foreslope on the left or right-hand side; a roadway cross-slope on the left or right-hand side; a placement of curves along the virtual roadway system; an angle of curves along the virtual roadway system; a roadway slope inside of curves along the virtual roadway system; one or more coefficients of friction along the virtual roadway system, one or more transitions from coefficients for friction along the virtual roadway system and the placement of these transitions on the virtual roadway system, etc.

In some embodiments, the curve testing standard data 141 may describe a plurality of curve characteristics which are indicated by one or more curve testing standards. The roadway visualization system 199 may include code and routines that are operational to extract or parse these curve characteristics from the curve testing standard data 141 and build the curve data structure 140 so that the curve data included in the curve data structure 140 describes these curve characteristics.

In some embodiments, the curve testing standard data 141 may also describe one or more roadway parameters. The roadway visualization system 199 may include code and routines that are operational to extract or parse these roadway parameters from the curve testing standard data 141 and build the curve data structure 140 so that the curve data included in the curve data structure 140 describes these criteria.

In some embodiments, a human user of the roadway visualization system 199 (e.g., an engineer) may input one or more of the roadway parameters that are included in the curve data that is stored in the curve data structure 140.

In some embodiments, the roadway visualization system 199 may include a realism system as described in U.S. patent application Ser. No. 15/013,936 filed on Feb. 2, 2016 and entitled "Realistic Roadway Virtualization System." The realism system may generate the roadway parameters included in the curve data as described in U.S. patent application Ser. No. 15/013,936. The roadway parameters may be checked against the one or more curve testing standards to ensure that their application to generating a virtual roadway would conform with these curve testing standards. For example, the curve testing standard data 141 may describe a range of acceptable values (or a threshold) for a particular roadway parameter generated by the realism system and the roadway visualization system 199 may check to ensure that the value for the particular roadway parameter that is included in the curve data structure is within the range (or does not violate the threshold) specified by the curve testing standard data 141.

The one or more curve testing standards described by the curve testing standard data 141 may include any known curve testing standard such as, for example, ISO 15622 (or any derivative or successor thereof).

In some embodiments, the roadway visualization system 199 may organize the curve data to form a plurality of sets of curve data. The plurality of sets of curve data may be configured to provide a wide variety of curves that may be included in a single virtual roadway or many different virtual roadways while also complying with the one or more curve testing standards. In this example way, the roadway visualization system 199 may build the curve data structure 140.

The curve data structure 140 may store data describing one or more sets of curve data. Each set of curve data may be configured to satisfy one or more curve characteristics.

In some embodiments, each set of curve data may be built so that it will provide a unique curve that is different in some way from other curves that would result from the other sets of curve data included in the curve data structure 140. Collectively, the plurality of sets of curve data may be configured by the roadway visualization system 199 so that they provide variation of curves to be included in a one or more visualizations 198.

The curve data structure 140 may be stored in a non-transitory memory of the roadway visualization system 199 (see, e.g., a memory 227 depicted in FIG. 2). In some embodiments, the curve testing standard data 141 may be stored in the curve data structure 140. In some embodiments, the curve testing standard data 141 may be stored in the non-transitory memory of the roadway visualization system 199.

The communication unit 145 may include hardware that transmits and receives data to and from the network 105.

In some embodiments, the communication unit 145 may transmit a set of curve data 143 to the network 105. For example, the set of curve data 143 may be included in a query addressed to one of the servers 150. The query may request (or be understood by the server 150 to request) a three-dimensional coordinate that will cause the virtualization application 170 of the roadway visualization system 199 to generate a visualization of a roadway include a curve that complies (or substantially matches) the set of curve data 143 included in the query.

In some embodiments, the communication unit 145 may receive, from the network 105, a three-dimensional coordinate that is responsive to a previously transmitted query. For example, the three-dimensional coordinate may be included in a response transmitted by a server 150 which performed the following steps: (1) received the query including the set of curve data 143; (2) determined coordinate data 147 describing a three-dimensional coordinate that will cause the virtualization application 170 to generate a visualization 198 of a roadway including a curve that complies (or substantially matches) the curve characteristics and/or roadway parameters included in the set of curve data 143 included in the query; (3) built a response including coordinate data 147; and (4) transmitted the response to the network 105. The communication unit 145 may parse the coordinate data 147 from the response and transmit the coordinate data 147 to the distribution manager 160.

In some embodiments, the communication unit 145 includes a port for direct physical connection to the network 105 or to another communication channel. For example, the communication unit 145 includes a USB, SD, CAT-5, or similar port for wired communication with the network 105. In some embodiments, the communication unit 145 includes a wireless transceiver for exchanging data with the network 105 or other communication channels using one or more wireless communication methods, including IEEE 802.11, IEEE 802.16, Bluetooth®, or another suitable wireless communication method.

In some embodiments, the communication unit 145 includes a cellular communications transceiver for sending and receiving data over a cellular communications network including via short messaging service (SMS), multimedia messaging service (MMS), hypertext transfer protocol (HTTP), direct data connection, WAP, e-mail, or another suitable type of electronic communication. In some embodiments, the communication unit 145 includes a wired port and a wireless transceiver. The communication unit 145 also provides other conventional connections to the network 105 for distribution of files or media objects using standard network protocols including TCP/IP, HTTP, HTTPS, and SMTP, etc.

Figure 7:
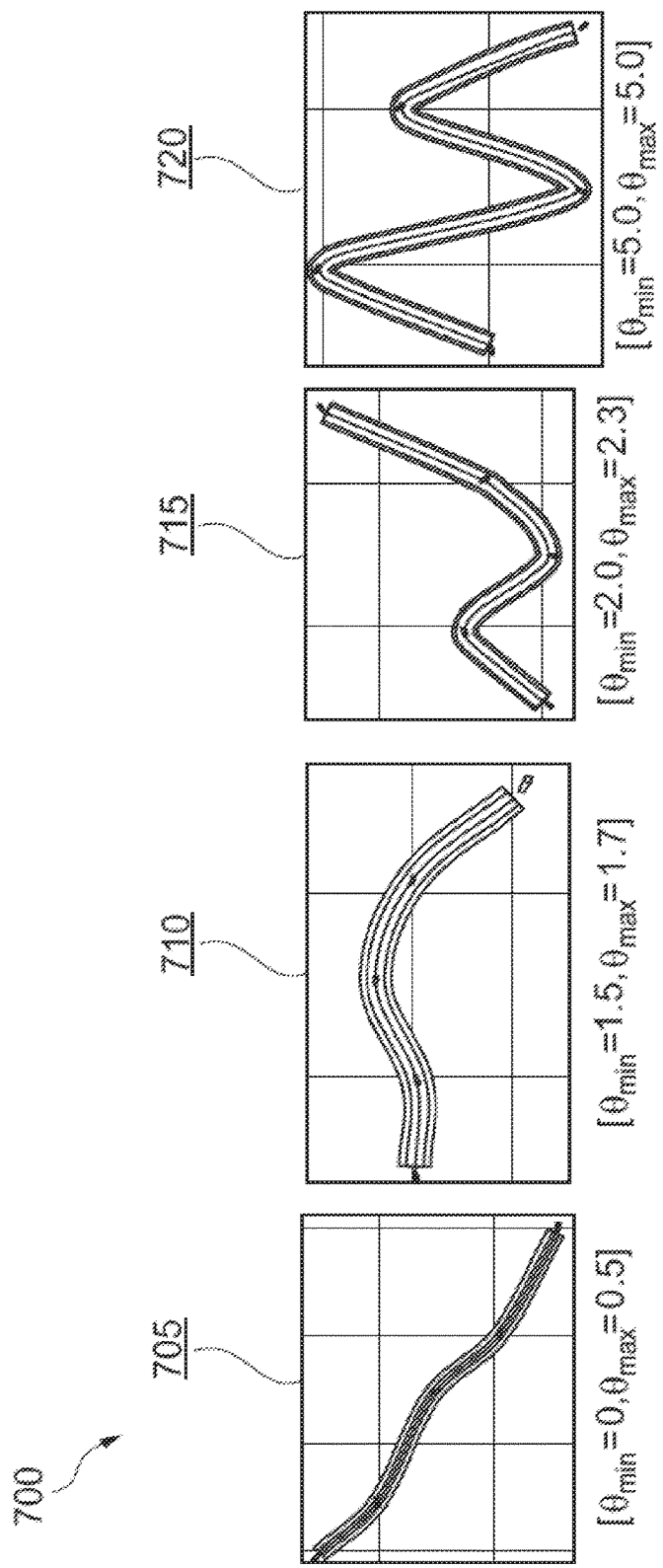
FIG. 7 is a block diagram including an example set of graphical user interfaces including examples of vertical curvature constraints.

The distribution manager 160 may include code and routines that are operable, when executed by a processor of the roadway visualization system 199, to generate a plurality of roadway segments using the servers 150 (see, e.g., FIG. 7). The distribution manager 160 may select, from the curve data structure 140, one or more sets of curve data 143. Each set of curve data 143 may describe a roadway segment to be generated.

The distribution manager 160 may cause the communication unit 145 to transmit each selected set of curve data 143 to a different server 150 via the network 105. In some embodiments, the distribution manager 160 may ensure that the selected sets of curve data 143 are distributed among many different servers 150 so that no one server 150 receives more than one set of curve data 143, thereby ensuring that a timing constraint is satisfied. The timing constraint may define a threshold for how much time it should take for each server to return response including an instance of coordinate data 147 responsive to the set of curve data 143 that the server 150 received. Each instance of coordinate data 147 may describe one three-dimensional coordinate (e.g., an X,Y,Z coordinate).

The distribution manager 160 may receive and aggregate the coordinate data 147 received from the network 105 to form aggregated data 149 which includes each of the three-dimensional coordinates received responsive to the sets of curve data 143 selected by the distribution manager 160 and transmitted by the communication unit 145. The distribution manager 160 may then transmit the aggregated data 149 to the virtualization application 170.

In some embodiments, the distribution manager 160 may include software that is stored in a non-transitory memory that is accessible and executable by a processor of the roadway visualization system 199.

The virtualization application 170 may include code and routines that are operable to receive data describing one or more three-dimensional coordinates as an input and then output a visualization 198 of a roadway that includes one or more curves that are generated based on the three-dimensional coordinates that are received as the input. The one or more three-dimensional coordinates may be described by the aggregated data 149 received from the distribution manager 160.

In some embodiments, the virtualization application 170 may include code and routines configured to generate a virtual environment that includes a virtual roadway system for testing an automobile design. The virtualization application 170 may include a roadway virtualization software.

In some embodiments, the virtualization application 170 may include a software application that is operable to provide the same or similar functionality as one or more of CarSim and Prescan.

In some embodiments, the virtualization application may include one or more of CarSim and Prescan. In some example embodiments, the roadway visualization system 199 may include a plugin for the virtualization application 170. For example, the roadway visualization system 199 (or a component thereof, such as the curve system described below with reference to FIG. 2) may be a plugin for one or more of CarSim and PreScan.

The virtualization application 170 may be stored in a non-transitory memory that is accessible and executable by a processor of the roadway visualization system 199.

The server 150 can be a hardware server that includes a processor, a memory and network communication capabilities. In some embodiments, the server 150 may include a cloud server. The server 150 may be communicatively coupled to the network 105. In some embodiments, the server 150 may include a cloud server.

As depicted in FIG. 1A, the each of the servers 150 includes an SMT solver 154A, 154B, 154C . . . 154N (referred to collectively as "SMT solvers 154" or individually as "SMT solver 154"). The "N" and illustrated ellipses depicted in FIG. 1A for the Nth server 150N and the Nth SMT solver 154N indicates that there may be any positive whole number of servers 150 and any positive whole number of SMT solvers 154.

In some embodiments, the SMT solver 154 may include code and routines stored on a non-transitory memory of the server 150 that are operable, when executed by a processor of the server 150, to (1) receive a set of curve data 143 as an input and (2) automatically determine and output an instance of coordinate data 147 describing a three-dimensional coordinate based on the set of curve data 143 received as an input.

In some embodiments, the SMT solver 154 may be operable to view the set of curve data as a query requesting a curve that will satisfy the set of curve data 143 included in the query. The SMT solver 154 may, upon being executed by the processor of the server 150, solve the query by identifying a three-dimensional coordinate that, when inputted in a virtualization application 170 of the roadway visualization system 199, will cause the roadway visualization system 199 to generate the visualization 198 including a curve (or a roadway segment including a curve) that is configured to at least substantially comply with the curve characteristics and/or roadway parameters described by the set of curve data 143. The roadway visualization system may receive the instance of coordinate data 147.

In some embodiments, an instance of coordinate data 147 received by the roadway visualization system 199 may be stored in a non-transitory memory (e.g., a buffer) by the distribution manager 160 and later combined with other instances of coordinate data 147 to form the aggregated data 149. Each instance of coordinate data 147 may cause the virtualization application 170 to generate a separate roadway segment and the aggregated data 149 may generate a virtual roadway comprised of the various roadway segments.

In some embodiments, the distribution manager 160 may organize the selected sets of curve data 143 to yield a particular virtual roadway having curve characteristics and roadway parameters that are different from other virtual roadways generated by the roadway visualization system 199 so that the virtual roadways used to test the design of an ADAS system is varied, thorough and comprehensive.

The SMT solver 154 or the server 150 may include a user profile for the roadway visualization system 199 that includes an identifier of which virtualization application 170 is used by the roadway visualization system 199 (and one or more requirements of a specification of the virtualization application 170) so that the input requirements of the virtualization application 170 used by the roadway visualization system 199 are known to the SMT solver 154. In this way the coordinate data 147 may be formatted in a way that is understandable to the virtualization application 170 so that computational errors do not occur. In some embodiments, each response may include an identifier of the virtualization application 170 so that a server-side user profile is not implemented.

In some embodiments, one or more of the roadway visualization system 199 and the SMT solvers 154 can be implemented using hardware including a field-programmable gate array ("FPGA") or an application-specific integrated circuit ("ASIC"). In some other embodiments, one or more of the roadway visualization system 199 and the SMT solvers 154 can be implemented using a combination of hardware and software.

In some embodiments, the roadway visualization system 199 may be stored in a combination of the devices and servers, or in one of the devices or servers.

In some embodiments, the roadway visualization system 199 may include code and routines configured to perform one or more steps of the method 300 described below with reference to FIG. 3 when executed by a processor, such as processor 225, described below with reference to FIG. 2.

The roadway visualization system 199 will be described in more detail below with reference to FIG. 2.

Referring now to FIG. 1B, depicted is a block diagram illustrating an example of a coordinate interpolation scheme 122 for generating one or more curves for a virtual roadway.

In element 123, five instances of three-dimensional coordinates are provided to the virtualization application 170. For example, three-dimensional instances (2), (3) and (4) may be described by the aggregated data. Instances (1) and (5) may be endpoints that are defined by a user or randomly selected. However, this may result in errors if the endpoints are not logical or are physically impossible. Accordingly, in some embodiments the endpoint instances (1) and (5) may be interpolated based on the location of instances (2), (3) and (4) relative to one another. Elements 124, 125 and 126 may depict the five instances of three-dimensional coordinates being analyzed to form a virtual roadway that includes three curves, one for each instance of a three-dimensional coordinate described by the aggregated data.

Example Electronic Devices

FIG. 2 is a block diagram illustrating an example computing device including a roadway visualization system 199.

In some embodiments, the roadway visualization system 199 may include an electronic device programmed or configured to perform one or more blocks of the method 300 described below with reference to FIG. 3.

In some embodiments, the roadway visualization system 199 may include an electronic device programmed or configured to execute one or more of the following algorithms which may be stored in the memory 227 and accessible and executable by the processor 225: a road segment generation algorithm 905 described below with reference to FIG. 9; a coverage consistency algorithm 1005 described below with reference to FIG. 10; and a virtual roadway generation algorithm 1105 described below with reference to FIG. 11.

In some embodiments, the roadway visualization system 199 may include a special-purpose computing device configured to provide some or all of the functionality described above with reference to the roadway visualization system 199 or below with reference to method 300 described below with reference to FIG. 3, the road segment generation algorithm 905 described below with reference to FIG. 9, the coverage consistency algorithm 1005 described below with reference to FIG. 10 and the virtual roadway generation algorithm 1105 described below with reference to FIG. 11.

The roadway visualization system 199 may include one or more of the following elements: a curve system 200; a virtualization application 170; a processor 225; a memory 227; a communication unit 245; a game engine 247 and an electronic display 249. The components of the roadway visualization system 199 are communicatively coupled by a bus 220. In some embodiments, the components of the roadway visualization system 199 are local to the same hardware so that the bus 220 is not necessary for communication among the components of the roadway visualization system 199. In some embodiments, communication structures or methods other than the bus 220 may be implemented.

The memory 227 is a non-transitory storage medium that stores instructions or data that may be accessed and executed by the processor 225. The instructions or data may include code for performing the techniques described herein. The memory 227 may include a dynamic random access memory (DRAM) device, a static random access memory (SRAM) device, flash memory, or some other memory device. In some embodiments, the memory 227 also includes a non-volatile memory or similar permanent storage device and media including a hard disk drive, a floppy disk drive, a CD-ROM device, a DVD-ROM device, a DVD-RAM device, a DVD-RW device, a flash memory device, or some other mass storage device for storing information on a more permanent basis.

The memory 227 may include one or more of the following elements: virtualization data 299; automobile design data 297; GUI data 295; time constraint data 243; one or more sets of curve data 143; one or more instances of coordinate data 147; the aggregated data 149; the curve testing standard data 141; and the curve data structure 140. The following elements were described above with reference to FIG. 1A or 1B, and so, their descriptions will not be repeated here: the one or more sets of curve data 143; the one or more instances of coordinate data 147; the aggregated data 149; the curve testing standard data 141; the curve data structure 140.

The virtualization data 299 may include graphical data describing a virtual environment. For example, the virtual environment generated by the virtualization application 170 may be described by the virtualization data 299. Each of the virtual objects included in the virtual environment may be described by the virtualization data 299.

The automobile design data 297 may describe a virtual automobile. The virtual automobile may be tested in the virtual environment described by the virtualization data 299. The automobile design data 297 may also include one or more models for the ADAS system to be tested by the virtualization application 170, other software included in the automobile and the automobile that will include the ADAS system and the other software.

The GUI data 295 may include graphical data for causing a display device to generate a visualization that includes the virtual environment described by the virtualization data 299. This virtual environment, and so the visualization, may include the virtual roadway including the one or more curves generated by the roadway visualization system 199.

The time constraint data 243 may describe one or more of the time constraints described above with reference to FIGS. 1A and 1B or below with reference to FIG. 3.

In some embodiments, the memory 227 stores any data necessary for the virtualization application 170 and the roadway visualization system 199 to provide its functionality. For example, the memory 227 may store data that describes one or more elements of the virtual environment so that the virtualization application 170 has data that may be used to generate the virtual environment. For example, the memory 227 may include some or all of the data or inputs described in U.S. patent application Ser. No. 15/013,936. The virtualization application 170 may include fields for receiving the data or inputs for generating the virtual environment and the GUI module 208 of the curve system 200 may input the data or inputs into the fields of the virtualization application 170.

The virtualization application 170 is communicatively coupled to the bus 220 via a signal line 230. The processor 225 is communicatively coupled to the bus 220 via a signal line 234. The memory 227 is communicatively coupled to the bus 220 via a signal line 236. The communication unit 245 is communicatively coupled to the bus 220 via a signal line 238. The game engine 247 is communicatively coupled to the bus 220 via a signal line 246. The electronic display 249 is communicatively coupled to the bus 220 via a signal line 250. In some embodiments, one or more of the elements of the roadway visualization system 199 may share a signal line for communication with the bus 220.

The virtualization application 170 includes a code and routines configured to generate a virtual environment that includes a virtual roadway system for testing an automobile design or an element of an automobile design such as an ADAS system. The virtualization application 170 may include a roadway virtualization software. The virtualization application 170 may be stored on the memory 227 and accessible by the processor 225 for execution so that the virtualization application 170 may provide its functionality.

In some embodiments, the curve system 200 is a plug-in installed in the virtualization application 170.

In some embodiments, the curve system 200 may include code and routines that are operable to receive the curve testing standard data 141 as an input and, when executed by the processor 225, perform one or more of the following steps: (1) build the curve data structure 140; (2) select one or more sets of curve data 143 that are selected to build a virtual roadway with the virtualization application 170; (3) acquire one or more instances of coordinate data 147 from one or more SMT solvers so that one instance of coordinate data 147 is acquired for each selected set of curve data 143; (4) build the aggregated data 149 based on the one or more instances of coordinate data 147; (5) provide the aggregated data 149 to the virtualization application 170; (6) provide one or more of the automobile design data 297 and data describing the parameters of the virtual environment to the virtualization application 170 (e.g., some or all of the data or inputs described in U.S. patent application Ser. No. 15/013,936); and (7) execute the virtualization application 170 so that the virtualization application 170 generates a virtual roadway including one or more curves that comply with the one or more curve testing standards described by the curve testing standard data 141.

The processor 225 includes an arithmetic logic unit, a microprocessor, a general-purpose controller, or some other processor array to perform computations and provide electronic display signals to a display device. The processor 225 processes data signals and may include various computing architectures including a complex instruction set computer (CISC) architecture, a reduced instruction set computer (RISC) architecture, or an architecture implementing a combination of instruction sets. Although FIG. 2 includes a single processor 225, multiple processors 225 may be included. The processor 225 may include a graphical processing unit. Other processors, operating systems, sensors, displays, and physical configurations may be possible.

The communication unit 245 may include hardware that transmits and receives data to and from the network 105. In some embodiments, the communication unit 245 includes a port for direct physical connection to the network 105 or to another communication channel. For example, the communication unit 245 includes a USB, SD, CAT-5, or similar port for wired communication with the network 105. In some embodiments, the communication unit 245 includes a wireless transceiver for exchanging data with the network 105 or other communication channels using one or more wireless communication methods, including IEEE 802.11, IEEE 802.16, Bluetooth®, or another suitable wireless communication method.

In some embodiments, the communication unit 245 includes a cellular communications transceiver for sending and receiving data over a cellular communications network including via SMS, MMS, HTTP, direct data connection, WAP, e-mail, or another suitable type of electronic communication. In some embodiments, the communication unit 245 includes a wired port and a wireless transceiver. The communication unit 245 also provides other conventional connections to the network 105 for distribution of files or media objects using standard network protocols including TCP/IP, HTTP, HTTPS, and SMTP, etc.

A game engine 247 may include any game engine capable of generating the virtual world described by the virtualization data 299. For example, the game engine 247 may include the Unity game engine published by Unity Technologies of San Francisco, Calif.

The electronic display 249 includes an electronic device that is operable to receive the GUI data 295 and display the visualization provided by the virtualization application 170. For example, the electronic display 249 may include a monitor or some other display device.

In some embodiments, the curve system 200 includes one or more of the following elements: a communication module 202; a data module 204; a distribution manager 160; and a GUI module 208.

The communication module 202 is communicatively coupled to the bus 220 via signal line 222. The data module 204 is communicatively coupled to the bus 220 via signal line 224. The distribution manager 160 is communicatively coupled to the bus 220 via signal line 226. The GUI module 208 is communicatively coupled to the bus 220 via signal line 228.

The communication module 202 may include code and routines configured to handle communications between the curve system 200 and other components of the roadway visualization system 199. In some embodiments, the communication module 202 can include a set of instructions executable by the processor 225 to provide the functionality described below for handling communications between the roadway visualization system 199 and other components of the environment 100 described above with reference to FIG. 1A. In some embodiments, the communication module 202 can be stored in the memory 227 of the roadway visualization system 199 and can be accessible and executable by the processor 225.

The communication module 202 sends and receives data, via the communication unit 245, to and from the network 105. For example, the communication module 202 transmits a set of curve data 143, via the communication unit 245, to the network 105. The communication module 202 receives, via the communication unit 245, coordinate data 147 from the network 105.

In some embodiments, the communication module 202 receives data from components of the roadway visualization system 199 and stores the data in the memory 227. For example, the communication module 202 receives the virtualization data 299 from the virtualization application 170 and stores the virtualization data 299 in the memory 227.

In some embodiments, the communication module 202 receives one or more instances of coordinate data 147 and stores them the memory 227.

The data module 204 may include code and routines configured to receive inputs (e.g., the curve testing standard data 141, one or more of the inputs described below with reference to FIGS. 9, 10 and 11, the coordinate data 147). The data module 204 may organize the inputs. For example, the data module 204 may cause the communication module 202 to retrieve the curve testing standard data 141 from the memory 227; the data module 204 may receive the curve testing standard data 141 from the communication module 202 and generate the curve data structure 140 based on the curve testing standard data 141. The data module 204 may also cause the communication module 202 to retrieve the one or more instances of the coordinate data 147 from the memory 227; the data module 204 may receive the one or more instances of the coordinate data 147 from the communication module 202 and aggregate them to form the aggregated data 149. In some embodiments, the data module 204 may be an element of the distribution manager 160.

In some embodiments, the data module 204 can be stored in the memory 227 of the roadway visualization system 199 and can be accessible and executable by the processor 225.

The distribution manager 160 may include code and routines configured to provide the functionality described above with reference to FIGS. 1A and 1B. The distribution manager 160 may include one or more of the following algorithms: the road segment generation algorithm 905 described below with reference to FIG. 9; the coverage consistency algorithm 1005 described below with reference to FIG. 10; and the virtual roadway generation algorithm 1105 described below with reference to FIG. 11.

In some embodiments, the distribution manager 160 can be stored in the memory 227 of the roadway visualization system 199 and can be accessible and executable by the processor 225.

The GUI module 208 may cause the communication module 202 to retrieve the aggregated data 149 from the memory 227 and then input the aggregated data 149 into a plurality of fields included in the virtualization application 170. The plurality of fields may include a set of fields for inputting values for three-dimensional coordinates that are required by the virtualization application 170 to generate a virtual roadway in the virtual environment that includes one or more curves. The virtualization application 170 is executed using the coordinate data 147 included in the aggregated data 149 as inputs to the plurality of fields. The virtualization application 170 generates, based on the coordinate data 147, a visualization output including the virtual environment and the virtual roadway system including one or more curves that comply with one or more curve testing standards.

In some embodiments, the GUI module 208 can be stored in the memory 227 of the roadway visualization system 199 and can be accessible and executable by the processor 225.

In some embodiments, the curve system 200 provides numerous benefits to the virtualization application 170. For example, without the curve system 200 a virtualization application cannot automatically design curves for inclusion in a virtual roadway that are guaranteed to comply with one or more curve testing standards while also being generated within a predetermined time constraint. Such inferior virtualization applications would require a time consuming brute force, or ad hoc, approach to curve generation that still would not be guaranteed to result in curves that comply with the one or more curve testing standards. The curve system 200 may beneficially solve this problem as a plugin for an existing virtualization applications or an element of a stand-alone virtualization solution such as, for example, the roadway visualization system 199.

Example Methods

Figure 3:
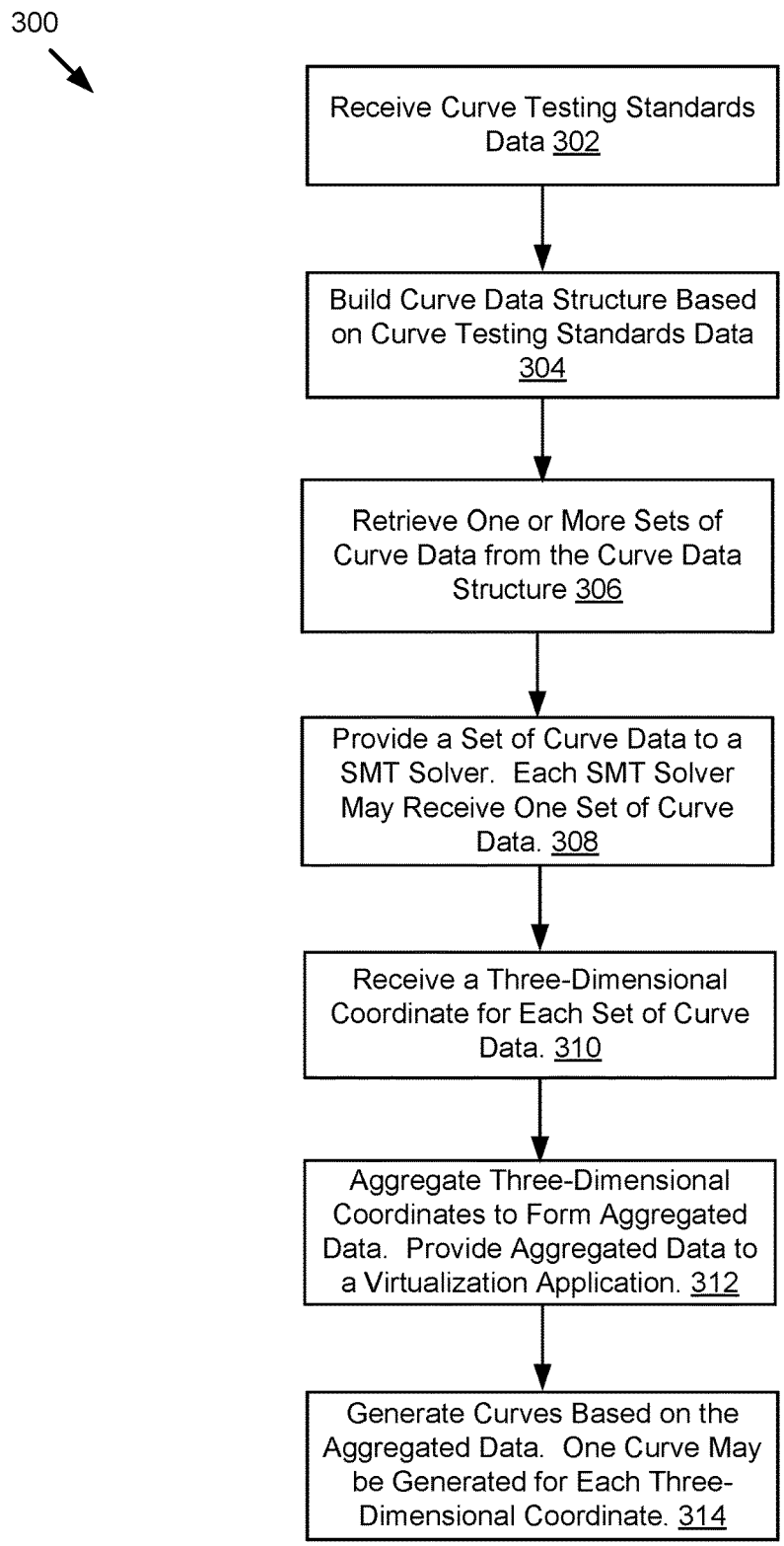
FIG. 3 is a flowchart of an example method for generating one or more curves for a virtual roadway.

Referring now to FIG. 3, depicted is a flowchart of an example method 300 for generating one or more curves for a virtual roadway.

At step 302, the curve testing standard data is received.

At step 304, the curve data structure is built based on the curve testing standard data.

At step 306, one or more sets of curve data are selected from the curve data structure. The one or more sets of curve data may be selected so that collectively they may be combined to form a virtual roadway. Each set of curve data may be selected to result in the generation of a roadway segment that is included in the virtual roadway.

At step 308, each set of curve data selected from the curve data structure may be transmitted to a different client device. For example, the client device may include a cloud server. Each client device may include an SMT solver. Each SMT solver may generate an instance of coordinate data. In some embodiments, each set of curve data may be transmitted to a different server including its own SMT solver.

In some embodiments, the coordinate data generated by a particular SMT solver describes a three-dimensional coordinate that is operable to result in the virtualization application generating a curve (or a road segment) that complies with the curve characteristics and/or roadway parameters described by the set of curve data that resulted in the particular SMT solver generating this particular instance of coordinate data.

At step 310, an instance of coordinate data is received for each set of curve data transmitted in step 308.

At step 312, the instances of coordinate data are aggregated to form the aggregated data. Step 312 may not occur until an instance of coordinate data is received at step 310 for each set of curve data transmitted at step 308. The aggregated data is provided to the virtualization application.

At step 314, a virtual roadway is generated. The virtual roadway may include two endpoints. The virtual roadway may include one curve for each instance of coordinate data included in the aggregated data. The end points may be determined by interpolating the three-dimensional coordinates described by the instances of coordinate data included in the aggregated data.

Optionally, instead of determining the end points by interpolation, the virtualization application may include a boundary constraint that defines the start and end of the virtual roadway. The boundary constraint may be expressed as follows:

$$(x_{min} \leq x_i \leq x_{max})^{\frown}(y_{min} \leq y_i \leq y_{max})^{\frown}(z_{min} \leq z_i \leq z_{max})$$

In some embodiments, the boundary constraint may be described an analysis of the aggregated data to determine the variables included in the previous paragraph.

Example GUIs/Visualizations

Referring now to FIG. 4, depicted is a block diagram including a set 400 of example GUIs 405, 410, 415, 420, 425 including a plurality of virtual roadway segments having designated number "n" of curves. Note that the endpoints do not count as curves. Accordingly, if n=0, then the road segment includes no curves but two endpoints.

Referring now to FIG. 5, depicted is a block diagram including an example set 500 of GUIs 505, 510 including examples of a node order constraint. The GUIs 505, 510 may optionally be outputted by the roadway visualization system described herein according to some embodiments as an intermediate step of providing a visualization that includes a completed virtual roadway. The GUIs 505, 510 are depicted here in order to illustrate an example impact of an absolute distance on the generation of a virtual roadway.

In GUI 505, the third curve point (101, 104) may appear before the first curve point (157, 208) and the second curve point (210, 158) in the x-axis.

In GUI 510, all the curves appear in order across the x-axis. For example, if one wants to visualize a road that approaches to the top of the hill with multiple intermediate flat areas, the constraint without an absolute difference needs to be selected so that the elevation of the road segment continues increasing along with the z-axis.

Referring now to FIG. 6A, depicted is a block diagram including an example set 600 of GUIs 605, 610 including examples of a horizontal curvature constraint and a vertical curve constraint. The GUIs 605, 610 may optionally be outputted by the roadway visualization system described herein according to some embodiments as an intermediate step of providing a visualization that includes a completed virtual roadway. The GUIs 605, 610 are depicted here in order to illustrate an example impact of the horizontal curvature constraint (see, e.g., GUI 605) and the vertical curve constraint (see, e.g., GUI 610) on the generation of a virtual roadway.

A curvature constraint specifies the minimum/maximum degree of the curvature. GUI 605 illustrates an example of horizontal curvature and GUI 610 illustrates an example of vertical curvature.

With regard to GUI 605, the horizontal curvature indicates the degree of a curve to the x-axis or y-axis without considering the elevation of the road segment on the z-axis.

With regard to GUI 610, the vertical curvature indicates the degree of a curve to the z-axis that can express such elevation. The constraints to characterize such curvatures may consider the change of the two slopes that can be calculated from the three points constituting a curve.

Figure 6B:
FIG. 6B is a block diagram including an example of a curvature constraint.

Referring to FIG. 6B, depicted is an example of a curvature constraint 615 that may be considered with reference to FIG. 6A. Here, two slopes constituting a curve may change in two different ways. A positive change occurs when the two slopes change to the same direction (e.g., both slopes are heading toward north-east). For example, with reference to GUI 605 of FIG. 6A, there is one positive change at point $(x_3,y_3,z_3)$. A negative change occurs when the two slopes changes to the opposite direction (e.g., one slope is heading toward north-east, and the other slope is heading toward north-west or south-east). For example, with reference to GUI 605 of FIG. 6A, there are two negative changes at point at $(x_1,y_1,z_1)$ and $(x_2,y_2,z_2)$. Referring back to FIG. 6B, the curvature constraint 615 assigns a higher degree on the negative changes compared to the positive changes. This is because the coefficients of two slope are added up in the negative change, but they are subtracted one from the other in the positive change.

An alternating road constraint may control the direction of roads to be altered. For example, if a road is directed to the north, then the next curve is directed to the south and should repeat this alternation. For example, GUI 510 of FIG. 5, GUI 605 of FIG. 6A and GUIs 715, 720 of FIG. 7 include such alternating roads along with x-axis and y-axis. Similarly, this effect can be applied to the z-axis. In this case, a road may have several consecutive hills so that a certain vehicle feature can be tested while it climbs up and down the hill. This type of effect can be obtained by constraining curve points to be appeared in an alternative way. Page 4, column 2, second paragraph of the Appendix depicts an example of an alternating road constraint.

Referring now to FIG. 7, depicted is a block diagram including an example set 700 of GUIs 705, 710, 715, 720 including examples of vertical curvature constraints.

Figure 8:
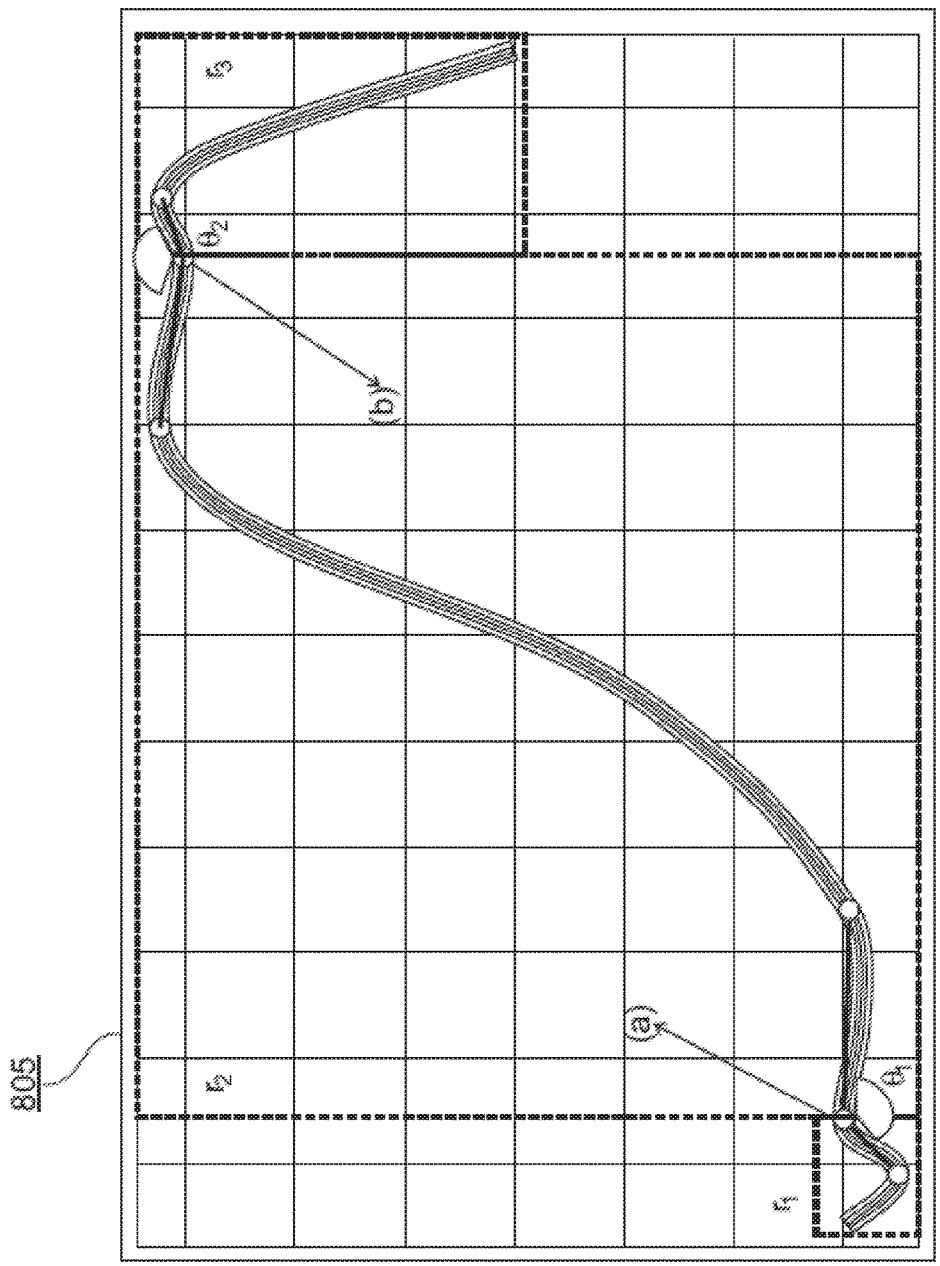
FIG. 8 is a block diagram including an example of a graphical user interface depicting an example of generating a virtual roadway from a plurality of road segments.

Referring now to FIG. 8, depicted is a block diagram including an example of a GUI 805 depicting an example of generating a virtual roadway from a plurality of road segments.

The virtual roadway depicted in the GUI 805 includes three road segments, $r_1$, $r_2$ and $r_3$. An example analysis provided by the roadway visualization system to generate such a virtual roadway may include the following: initially, a road segment is generated using the road segment generation algorithm 905 depicted in FIG. 9 and executed by the roadway visualization system. The roadway visualization system knows the coordinates of the dead ends of the generated road segment. The adjacent road segment can then be generated by adding the constraint that the dead end of the new road segment must be the same as one of the dead ends of the previously generated road segment; this constraint ensures that the two road segments are contiguous.

Experimentation has shown that application of the road segment generation algorithm 905 depicted in FIG. 9 may result in unrealistic virtual roadways because there are no curve coverage criteria applied to the newly appeared road segments after their generation. For example, with reference to FIG. 8, $r_1$, $r_2$ and $r_3$ can be independently generated from their respective curve coverage criteria (here, referred to as C1, C2 and C3, respectively for each of $r_1$, $r_2$ and $r_3$. Such coverage criteria may be referred to as the local coverage criteria. The composition introduces other new road segments that are not constrained by C1, C2 and C3. For example, with reference to FIG. 8, (a) and (b) are such road segments. This may result in producing unrealistic virtual roadways such as one road segment being directed to the east, while its adjacent segment is directed to the opposite direction.

Referring now to FIG. 10, depicted is an example of a coverage consistency algorithm 1005 which may be implemented by the roadway visualization system, according to some embodiments. To generate more realistic road networks, the roadway visualization system may apply a global curve coverage criteria. This may be applied to the output of the road segment generation algorithm 905 depicted in FIG. 9. The global curve coverage criteria, denoted as $C_g$, may be applied to one or more road segments included in a virtual roadway. This includes not only the road segments constrained by the local coverage criteria (e.g., with reference to FIG. 8, $r_1$, $r_2$ and $r_3$), but also the road segments that are newly appeared after the composition (e.g., with reference to FIG. 8, (a) and (b)). Accordingly, the coverage consistency algorithm 1005 of FIG. 10 includes the global curve coverage criteria ("$C_g$") that provided as an input to generate a virtual roadway.

The global curve coverage criteria may be a predetermined value or inputted to the roadway visualization system by an engineer or some other human user of the roadway visualization system.

Since the coverage consistency algorithm 1005 includes two different criteria (i.e., the local coverage criteria and the global curve coverage criteria), it is possible to have a conflict between two criteria. For example, if a certain local coverage criteria states that any two consecutive curves in a road segment should be separated at least 70 meters and at most 120 meters and the global coverage criteria states that any two consecutive curves in a road network should be separated at least 50 meters and at most 100 meters. In this example the two criteria conflict because a certain road segment may have curves that are separated by more than 100 meters, which does not conform to the global coverage criteria.

Accordingly, the coverage consistency algorithm 1005 includes code and routines that are operable to check the consistency of the two criteria. The coverage consistency algorithm 1005 takes inputs of a set of the local coverage criteria ($[C_i]^k{}_1$) and the global coverage criteria $C_g$. The coverage consistency algorithm 1005 checks if the minimum/maximum parameters of (N, Θ, D) in the local coverage criteria are bounded by that of the global coverage criteria. Each composition may introduce a curve using the term (k−1) in lines 3 and 5 of the coverage consistency algorithm 1005. For example, with reference to FIG. 8, (a) and (b) are the new curves that appear after composing $r_1$, $r_2$ and $r_3$. If this coverage consistency check fails, a virtual roadway cannot be generated due to the conflict of the two coverage criteria.

Referring now to FIG. 11, depicted is an example of a virtual roadway generation algorithm 1105 which may be implemented by the roadway visualization system, according to some embodiments.

The virtual roadway generation algorithm 1105 beneficially combines the functionality of the road segment generation algorithm 905 and the coverage consistency algorithm 1005.

The virtual roadway generation algorithm 1105 receives the local coverage criteria ($[C_i]^k{}_1$) and the global coverage criterion ($C_g$) as inputs. The virtual roadway generation algorithm 1105 first determines whether there is inconsistency between the local and the global coverage criteria (see, e.g., line 3 of the virtual roadway generation algorithm 1105). If the two criteria are determined to be consistent, then the virtual roadway generation algorithm 1105 proceeds to the next step. Otherwise it terminates with the exception of No-Sol.

Next, the virtual roadway generation algorithm 1105 picks a coverage criteria (or criterion) from a set of the local coverage criteria to generate a road segment that conforms to the coverage criteria (see, e.g., line 7 of the virtual roadway generation algorithm 1105). Note that the virtual roadway generation algorithm 1105 generates only one road segment from each local coverage criteria since the purpose of generating virtual roadways is to compose multiple road segments that conform to their respective local coverage criteria.

In some embodiments, the virtual roadway generation algorithm 1105 then adds two constraints to the local coverage criteria that will be examined in the next iteration ($C_{i+1}$).

The first constraint is that one of the dead ends of the next road segment be the same (or substantially the same) as that of the previously generated road segment (see, e.g., line 8 of the virtual roadway generation algorithm 1105).

The second constraint is that the road segments newly appeared (e.g., (a) and (b) in FIG. 8) by composing the two road segments must conform to the curvature constraint of the global coverage criteria (see, e.g., lines 9 and 10 of the virtual roadway generation algorithm 1105).

Finally, the virtual roadway generation algorithm 1105 stores the solution (see, e.g., line 11 of the virtual roadway generation algorithm 1105) and repeats this process for all the local coverage criteria.

In the above description, for purposes of explanation, numerous specific details are set forth in order to provide a thorough understanding of this disclosure. It will be apparent, however, to one skilled in the art that the disclosure can be practiced without these specific details. In some instances, structures and devices are shown in block diagram form in order to avoid obscuring the description. For example, the present embodiments can be described above primarily with reference to user interfaces and particular hardware. However, the present embodiments can apply to any type of computing device that can receive data and commands, and any peripheral devices providing services.

Reference in this disclosure to "some embodiments" or "some instances" means that a particular feature, structure, or characteristic described in connection with the embodiments or instances can be included in at least one embodiment of the description. The appearances of the phrase "In some embodiments" in various places in this disclosure are not necessarily all referring to the same embodiments.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms including "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

The present embodiments of this disclosure can also relate to an apparatus for performing the operations herein. This apparatus may be specially constructed for the required purposes, or it may include a general-purpose computer selectively activated or reconfigured by a computer program stored in the computer. Such a computer program may be stored in a computer-readable storage medium, including, but is not limited to, any type of disk including floppy disks, optical disks, CD-ROMs, and magnetic disks, read-only memories (ROMs), random access memories (RAMs), EPROMs, EEPROMs, magnetic or optical cards, flash memories including USB keys with non-volatile memory, or any type of media suitable for storing electronic instructions, each coupled to a computer system bus.

This disclosure can take the form of some entirely hardware embodiments, some entirely software embodiments or some embodiments containing both hardware and software elements. In some preferred embodiments, this disclosure is implemented in software, which includes, but is not limited to, firmware, resident software, microcode, etc.

Furthermore, the description can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device. The computer-readable medium may be a tangible or non-transitory computer-readable storage medium. The computer-readable medium may store computer executable code. The computer-readable medium may be communicatively coupled to a processor. The processor may be programmed to execute one or more portions of the computer-executable code.

A data processing system suitable for storing or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including, but not limited, to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem, and Ethernet cards are just a few of the currently available types of network adapters.

Finally, the algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. In addition, this disclosure is not described with reference to any particular programming language. It will be appreciated that a variety of programming languages may be used to implement the teachings of this disclosure as described herein.

The foregoing description of the embodiments of this disclosure has been presented for the purposes of illustration and description. It is not intended to be exhaustive or to limit this disclosure to the precise form disclosed. Many modifications and variations are possible in light of the above teaching. It is intended that the scope of the disclosure be limited not by this detailed description, but rather by the claims of this application. As will be understood by those familiar with the art, this disclosure may be embodied in other specific forms without departing from the spirit or essential characteristics thereof. Likewise, the particular naming and division of the modules, routines, features, attributes, methodologies, and other aspects are not mandatory or significant, and the mechanisms that implement this disclosure or its features may have different names, divisions, or formats. Furthermore, as will be apparent to one of ordinary skill in the relevant art, the modules, routines, features, attributes, methodologies, and other aspects of the disclosure can be implemented as software, hardware, firmware, or any combination of the three. Also, wherever a component, an example of which is a module, of this disclosure is implemented as software, the component can be implemented as a standalone program, as part of a larger program, as a plurality of separate programs, as a statically or dynamically linked library, as a kernel-loadable module, as a device driver, or in every and any other way known now or in the future to those of ordinary skill in the art of computer programming. Additionally, the disclosure is in no way limited to embodiment in any specific programming language, or for any specific operating system or environment. Accordingly, the disclosure is intended to be illustrative, but not limiting, of the scope of this disclosure, which is set forth in the following claims.

What is claimed is:

1. A system to depict a graphical display output including a visualization of a virtual roadway including curves that comply with a curve testing standard, the system comprising:
a roadway visualization system including a non-transitory memory, a processor, an electronic display and a virtualization application including a curve system, wherein the virtualization application and the curve system are stored in non-transitory memory which is communicatively coupled to the processor;
wherein the virtualization application includes instructions that, responsive to being executed by the processor and receiving an input from the curve system, cause the processor to generate graphical data operable to cause the electronic display to depict a visualization including a virtual environment having a virtual roadway including curves that are generated based on the input from the curve system;
wherein the roadway visualization system is communicatively coupled to Satisfiability Modulo Theories solvers;
wherein the curve system includes instructions that, responsive to being executed by the processor, cause the processor to perform steps including:
importing curve testing standard data describing a plurality of criteria for the curves to comply with a curve testing standard;
selecting sets of curve data from the curve testing standard data that describe one or more criteria from the plurality of criteria, wherein each set of curve data results in a unique curve being generated and each unique curve is different from other curves;
providing one of the sets of curve data to each of the Satisfiability Modulo Theories solvers which are each operable to analyze the one or more criteria to output a three-dimensional coordinate;
aggregating the three-dimensional coordinate from each of the Satisfiability Modulo Theories solvers to form aggregated data; and
providing the aggregated data to the virtualization application as the input;
wherein the virtualization application generates the graphical data based on the input and causes the electronic display to depict the visualization including the virtual roadway including the curves that comply with the curve testing standard; and wherein the plurality of criteria include an alternating road constraint that requires consecutive curves of the virtual roadway generated based on the aggregated data to alternate in curvature directions.

2. The system of claim 1, wherein the curve system is a plug-in that is an element of the virtualization application.

3. The system of claim 1, wherein the plurality of criteria includes a curvature constraint that specifies minimum and maximum degrees of curvature of the curves, the curvature constraint including a horizontal curvature constraint that limits an x-axis degree of the curve or a y-axis degree of the curve and a vertical curvature that limits a z-axis degree of the curve that describes elevation.

4. The system of claim 1, wherein the curve system further causes the processor to perform steps including checking a consistency between a local coverage criteria that limits individual road segments and a global coverage criteria that ensures that individual road segments are connected to form a realistic version of the virtual roadway.

5. The system of claim 1, wherein the roadway visualization system is operable so that the curves generated by the virtualization application always comply with the curve testing standard.

6. The system of claim 1, wherein the visualization is generated within a predetermined time constraint.

7. A method to depict a graphical display output including a visualization of a virtual roadway including curves that comply with a curve testing standard, the method comprising
importing curve testing standard data describing a plurality of criteria for the curves to comply with a curve testing standard to a curve system included in a virtualization application, wherein the virtualization application includes instructions that, responsive to being executed by a processor, cause the processor to generate graphical data operable to cause an electronic display communicatively coupled to the virtualization application to depict a visualization including a virtual environment having a virtual roadway including curves that are generated based on an input from the curve system describing a three-dimensional coordinate for each of the curves;
providing, by the curve system, a set of curve data from sets of curve data to each Satisfiability Modulo Theories solver of Satisfiability Modulo Theories solvers, wherein:
the sets of curve data describe one or more criteria from the plurality of criteria;
each set of curve data results in a unique curve being generated and each unique curve is different from other curves; and
the Satisfiability Modulo Theories solvers are each operable to analyze the one or more criteria to output the three-dimensional coordinate which is configured by each Satisfiability Modulo Theories solver to cause the virtualization application to output the curves that are compliant with the one or more criteria described by the set of curve data;
aggregating the three-dimensional coordinate from each of the Satisfiability Modulo Theories solvers to form aggregated data; and
providing, by the curve system, the aggregated data to the virtualization application as the input, wherein the virtualization application generates the graphical data based on the input and causes the electronic display to depict the visualization including the virtual roadway including the curves that comply with the curve testing standard;
wherein the plurality of criteria include an alternating road constraint that requires consecutive curves of the virtual roadway generated based on the aggregated data to alternate in curvature directions.

8. The method of claim 7, wherein the curve system is a plug-in that is an element of the virtualization application.

9. The method of claim 7, wherein the curve testing standard is selected from a set including one or more of the following curve testing standards: ISO 15622; ISO 11270; ISO 3888; ISO 11067; ISO 17361; and ISO 17387.

10. The method of claim 7, wherein each Satisfiability Modulo Theories solver is an element of a different server.

11. The method of claim 10, wherein the curve system is communicatively coupled to each different server via a wireless network.

12. The method of claim 7, wherein the virtualization application is operable so that the curves generated by the virtualization application always comply with the curve testing standard because the curves are always generated based on the one or more criteria of the curve testing standard.

13. The method of claim 7, wherein the visualization is generated within a predetermined time constraint.

14. A non-transitory memory comprising computer code which, when executed by a processor, causes the processor to perform steps comprising:
importing curve testing standard data describing a plurality of criteria for curves to comply with a curve testing standard to a curve system included in a virtualization application, wherein the virtualization application includes instructions that, responsive to being executed by a processor, cause the processor to generate graphical data operable to cause an electronic display communicatively coupled to the virtualization application to depict a visualization including a virtual environment having a virtual roadway including curves that are generated based on an input from the curve system describing a three-dimensional coordinate for each of the curves;
providing, by the curve system, a set of curve data from sets of curve data to each Satisfiability Modulo Theories solver of Satisfiability Modulo Theories solvers, wherein the sets of curve data describe one or more criteria from the plurality of criteria, each set of curve data results in a unique curve being generated and each unique curve is different from other curves, and the Satisfiability Modulo Theories solvers are each operable to analyze the one or more criteria to output the three-dimensional coordinate which is configured by each Satisfiability Modulo Theories solver to cause the virtualization application to output the curves that are compliant with the one or more criteria described by the set of curve data;
aggregating the three-dimensional coordinate from each of the Satisfiability Modulo Theories solvers to form aggregated data; and
providing, by the curve system, the aggregated data to the virtualization application as the input, wherein the virtualization application generates the graphical data based on the input and causes the electronic display to depict the visualization including the virtual roadway including the curves that comply with the curve testing standard;

wherein the plurality of criteria include an alternating road constraint that requires consecutive curves of the virtual roadway generated based on the aggregated data to alternate in curvature directions.

15. The non-transitory memory of claim 14, wherein the curve system is a plug-in that is an element of the virtualization application.

16. The non-transitory memory of claim 14, wherein the curve testing standard is selected from a set including one or more of the following curve testing standards: ISO 15622; ISO 11270; ISO 3888; ISO 11067; ISO 17361; and ISO 17387.

17. The non-transitory memory of claim 14, wherein each Satisfiability Modulo Theories solver is an element of a different server.

18. The non-transitory memory of claim 17, wherein the curve system is communicatively coupled to each different server via a wireless network.

19. The non-transitory memory of claim 14, wherein the virtualization application is operable so that the curves generated by the virtualization application always comply with the curve testing standard because the curves are always generated based on the one or more criteria of the curve testing standard.

* * * * *